(12) United States Patent
Wu et al.

(10) Patent No.: US 11,990,429 B2
(45) Date of Patent: *May 21, 2024

(54) DUMMY DIE PLACEMENT WITHOUT BACKSIDE CHIPPING

(71) Applicant: Taiwan Semiconductor Manufacturing Co., Ltd., Hsinchu (TW)

(72) Inventors: Chih-Wei Wu, Zhuangwei Township (TW); Ying-Ching Shih, Hsinchu (TW); Kung-Chen Yeh, Taichung (TW); Li-Chung Kuo, Taipei (TW); Pu Wang, Hsinchu (TW); Szu-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,548

(22) Filed: Nov. 28, 2022

(65) Prior Publication Data
US 2023/0092361 A1 Mar. 23, 2023

Related U.S. Application Data

(60) Continuation of application No. 17/113,396, filed on Dec. 7, 2020, now Pat. No. 11,515,267, which is a
(Continued)

(51) Int. Cl.
*H01L 23/00* (2006.01)
*H01L 21/3105* (2006.01)
(Continued)

(52) U.S. Cl.
CPC ...... *H01L 23/562* (2013.01); *H01L 21/31053* (2013.01); *H01L 21/486* (2013.01);
(Continued)

(58) Field of Classification Search
CPC ............. H01L 23/562; H01L 21/31053; H01L 21/486; H01L 21/561; H01L 21/563;
(Continued)

(56) References Cited

U.S. PATENT DOCUMENTS

| 10,304,784 B2 | 5/2019 | Kim et al. |
| 10,529,690 B2 | 1/2020 | Shih et al. |

(Continued)

FOREIGN PATENT DOCUMENTS

| CN | 107887343 A | 4/2018 |
| CN | 108074828 A | 5/2018 |

(Continued)

*Primary Examiner* — Tong-Ho Kim
(74) *Attorney, Agent, or Firm* — Slater Matsil, LLP

(57) ABSTRACT

A method includes bonding a second package component to a first package component, bonding a third package component to the first package component, attaching a dummy die to the first package component, encapsulating the second package component, the third package component, and the dummy die in an encapsulant, and performing a planarization process to level a top surface of the second package component with a top surface of the encapsulant. After the planarization process, an upper portion of the encapsulant overlaps the dummy die. The dummy die is sawed-through to separate the dummy die into a first dummy die portion and a second dummy die portion. The upper portion of the encapsulant is also sawed through.

20 Claims, 33 Drawing Sheets

Related U.S. Application Data division of application No. 16/415,009, filed on May 17, 2019, now Pat. No. 10,861,799.

(51) Int. Cl.
| | |
|---|---|
| *H01L 21/48* | (2006.01) |
| *H01L 21/56* | (2006.01) |
| *H01L 21/78* | (2006.01) |
| *H01L 23/31* | (2006.01) |
| *H01L 23/498* | (2006.01) |
| *H01L 25/00* | (2006.01) |
| *H01L 25/18* | (2023.01) |

(52) U.S. Cl.
CPC .......... *H01L 21/561* (2013.01); *H01L 21/563* (2013.01); *H01L 21/78* (2013.01); *H01L 23/3128* (2013.01); *H01L 23/49827* (2013.01); *H01L 25/18* (2013.01); *H01L 25/50* (2013.01)

(58) Field of Classification Search
CPC ................. H01L 21/78; H01L 23/3128; H01L 23/49827; H01L 25/18; H01L 25/50; H01L 24/16; H01L 2224/05157; H01L 2224/05166; H01L 2224/05181; H01L 2224/05184; H01L 2224/05186; H01L 2224/05624; H01L 2224/05639; H01L 2224/05644; H01L 2224/05647; H01L 2224/05684; H01L 2224/06181; H01L 2224/13082; H01L 2224/13109; H01L 2224/13111; H01L 2224/13116; H01L 2224/13124; H01L 2224/13139; H01L 2224/13144; H01L 2224/13147; H01L 2224/13155; H01L 2224/13164; H01L 2224/1403; H01L 2224/14181; H01L 2224/2919; H01L 2224/81193; H01L 2224/95; H01L 25/0655; H01L 25/16; H01L 2224/16145; H01L 2224/16227; H01L 2224/32145; H01L 2224/32225; H01L 2224/92125; H01L 2224/94; H01L 2225/06541; H01L 2924/15311; H01L 2924/19104; H01L 2924/19105; H01L 2924/3511; H01L 23/5384; H01L 25/0652; H01L 2224/73204; H01L 2224/97; H01L 2225/06513; H01L 2225/06517; H01L 2225/06568; H01L 2924/18161; H01L 21/56; H01L 23/3157; H01L 25/0657; H01L 21/52; H01L 21/565; H01L 23/31; H01L 23/525
USPC ........................................................ 257/668
See application file for complete search history.

(56) References Cited

U.S. PATENT DOCUMENTS

| | | | |
|---|---|---|---|
| 10,658,306 | B2 | 5/2020 | Lu |
| 10,867,965 | B2 | 12/2020 | Shih et al. |
| 11,515,267 | B2* | 11/2022 | Wu ............... H01L 25/0655 |
| 2009/0289339 | A1 | 11/2009 | Hu et al. |
| 2016/0358865 | A1 | 12/2016 | Shih et al. |
| 2018/0122750 | A1* | 5/2018 | Lu ............... H01L 23/49822 |
| 2018/0138101 | A1* | 5/2018 | Yu ............... H01L 23/481 |
| 2018/0138151 | A1 | 5/2018 | Shih et al. |
| 2019/0096825 | A1 | 3/2019 | Kim et al. |

FOREIGN PATENT DOCUMENTS

| | | |
|---|---|---|
| DE | 102017122096 A1 | 5/2018 |
| DE | 102017122831 A1 | 5/2018 |
| KR | 20180054419 A | 5/2018 |
| TW | 201822311 A | 6/2018 |
| TW | 201916277 A | 4/2019 |

* cited by examiner

DUMMY DIE PLACEMENT WITHOUT BACKSIDE CHIPPING

CROSS-REFERENCE TO RELATED APPLICATIONS

This application is a continuation of U.S. patent application Ser. No. 17/113,396, entitled "Dummy Die Placement Without Backside Chipping," and filed Dec. 7, 2020, which is a divisional of U.S. patent application Ser. No. 16/415,009, entitled "Dummy Die Placement Without Backside Chipping," and filed on May 17, 2019, now U.S. Pat. No. 10,861,799 issued Dec. 8, 2020, which applications are hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
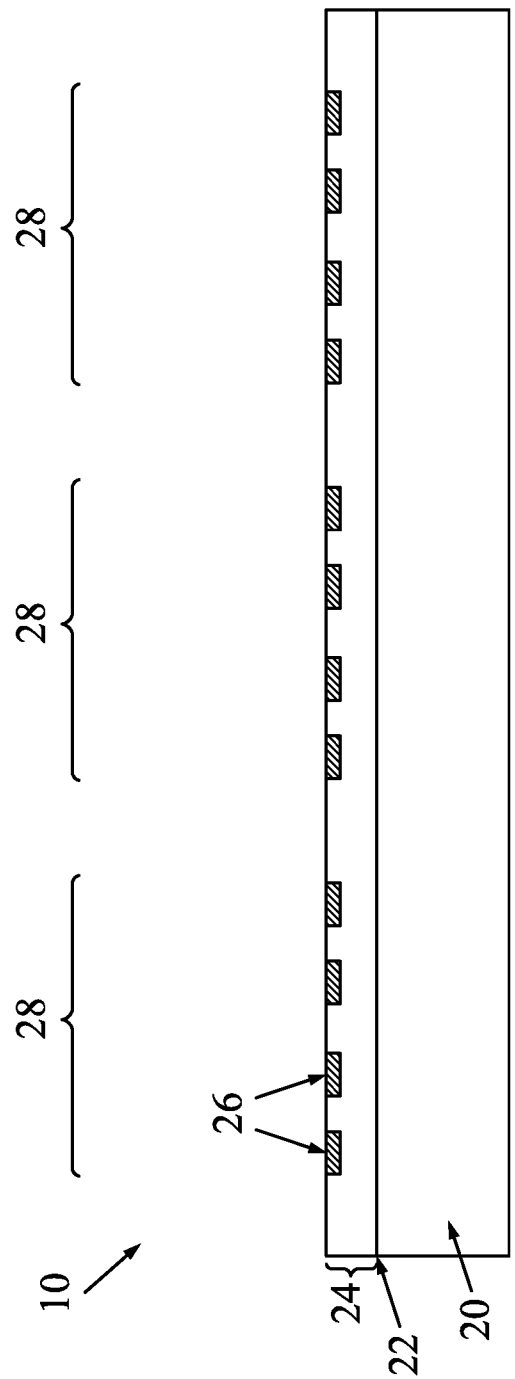
FIGS. 1-5, 6A, 6B, 6C, 6D, 6E, 6F, and 7-14 are cross-sectional views and plan views in an example process of forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package structure including dummy dies and the method of forming the same are provided in accordance with various embodiments. The intermediate stages in the formation of the package structure are illustrated in accordance with some embodiments. Some variations of some embodiments are discussed. Throughout the various views and illustrative embodiments, like reference numbers are used to designate like elements. In accordance with some embodiments of the present disclosure, a package structure including dummy dies are placed adjacent the active dies to reduce the warpage of the package structure. This reduction of the warpage of the package structure enables a more reliable package structure by reducing the likelihood of cold joints between the active dies and the interposer. In accordance with some embodiments, the dummy dies are placed along the periphery of the package structure, such as in or near the scribe line regions. Accordingly, the dummy dies are sawed through when the package structure is singulated. A layer of molding compound is left overlapping the dummy dies to prevent the chipping of the dummy dies in the singulation.

Embodiments will be described with respect to a specific context, namely a Die-Interposer-Substrate stacked package using Chip-on-Wafer-on-Substrate (CoWoS) processing. Other embodiments may also be applied, however, to other packages, such as a Die-Die-Substrate stacked package, and other processing. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

FIGS. 1-5, 6A, 6B, 6C, 6D, 6E, 6F, and 7-14 illustrate the cross-sectional views and plane views (such as top views) of intermediate stages in the formation of a package structure in accordance with some embodiments of the present disclosure. The corresponding processes are also reflected schematically in the process flow shown in FIG. 23.

FIG. 1 illustrates the formation of wafer 10, which includes package components 28 (FIG. 2) in accordance with some embodiments. Package components 28 may be device dies, packages, or the like. A package component 28 may comprise any number of dies, substrates, transistors, active devices, passive devices, or the like. In an embodiment, package component 28 may include substrate 20, which may be a bulk semiconductor substrate, a semiconductor-on-insulator (SOI) substrate, a multi-layered semiconductor substrate, or the like. The semiconductor substrate is formed of a semiconductor material, which may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Substrate 20 may be doped or undoped. Devices, such as transistors, capacitors, resistors, diodes, and the like, may be formed in and/or on an active surface 22 of semiconductor substrate 20.

A package component 28 may include interconnect structure 24, which includes one or more dielectric layer(s) and respective metallization pattern(s) formed on the active surface 22. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, electrical connectors 26, such as conductive pillars (for example, comprising a metal such as copper), are formed in and/or on the interconnect structure 24 to provide an external electrical connection to the circuitry and devices. In accordance with some embodiments, the electrical connectors 26 protrude from the interconnect structure 24 to form pillar structures.

In accordance with some embodiments of the present disclosure, a plurality of inter-metallization dielectric (IMD) layers may be formed in the interconnect structure 24. An IMD layer may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP) process.

Figure 2:
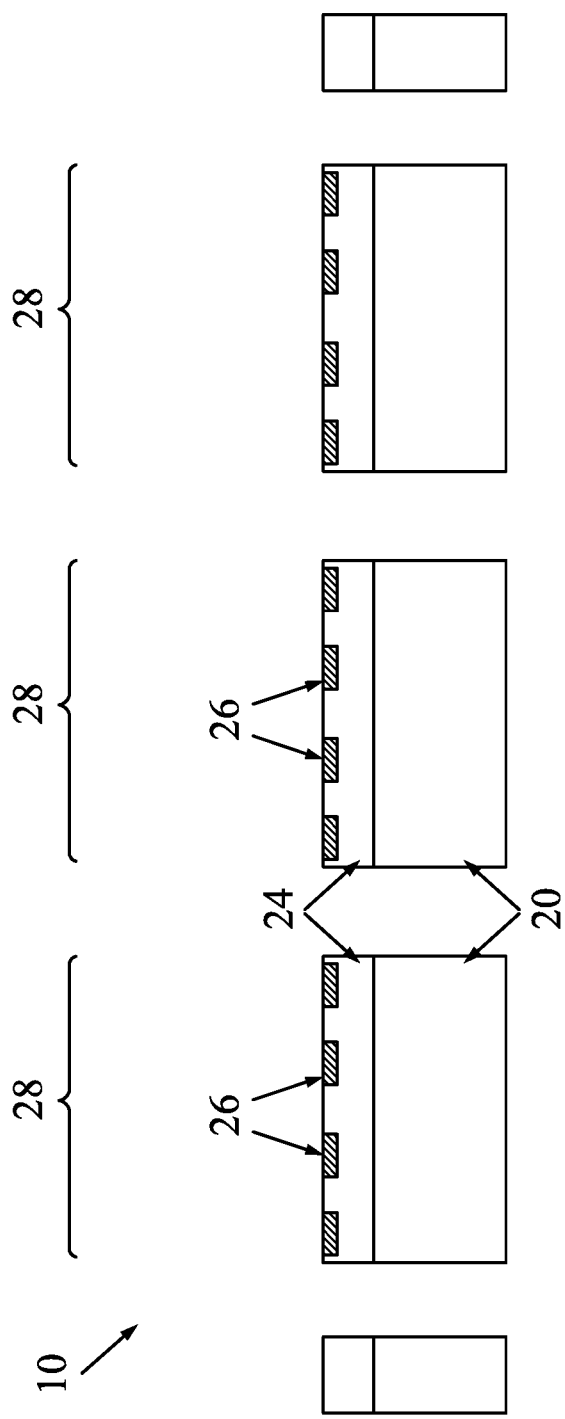

In FIG. 2, wafer 10 is singulated into individual package components 28. Typically, package components 28 contain the same circuitry, such as devices and metallization patterns, although the dies may have different circuitry. The singulation may be through blade sawing, laser dicing, or the like.

Each of package components 28 may include one or more logic dies (e.g., central processing unit, graphics processing unit, field-programmable gate array (FPGA), system-on-chip (SOC) dies, microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof.

Figure 23:
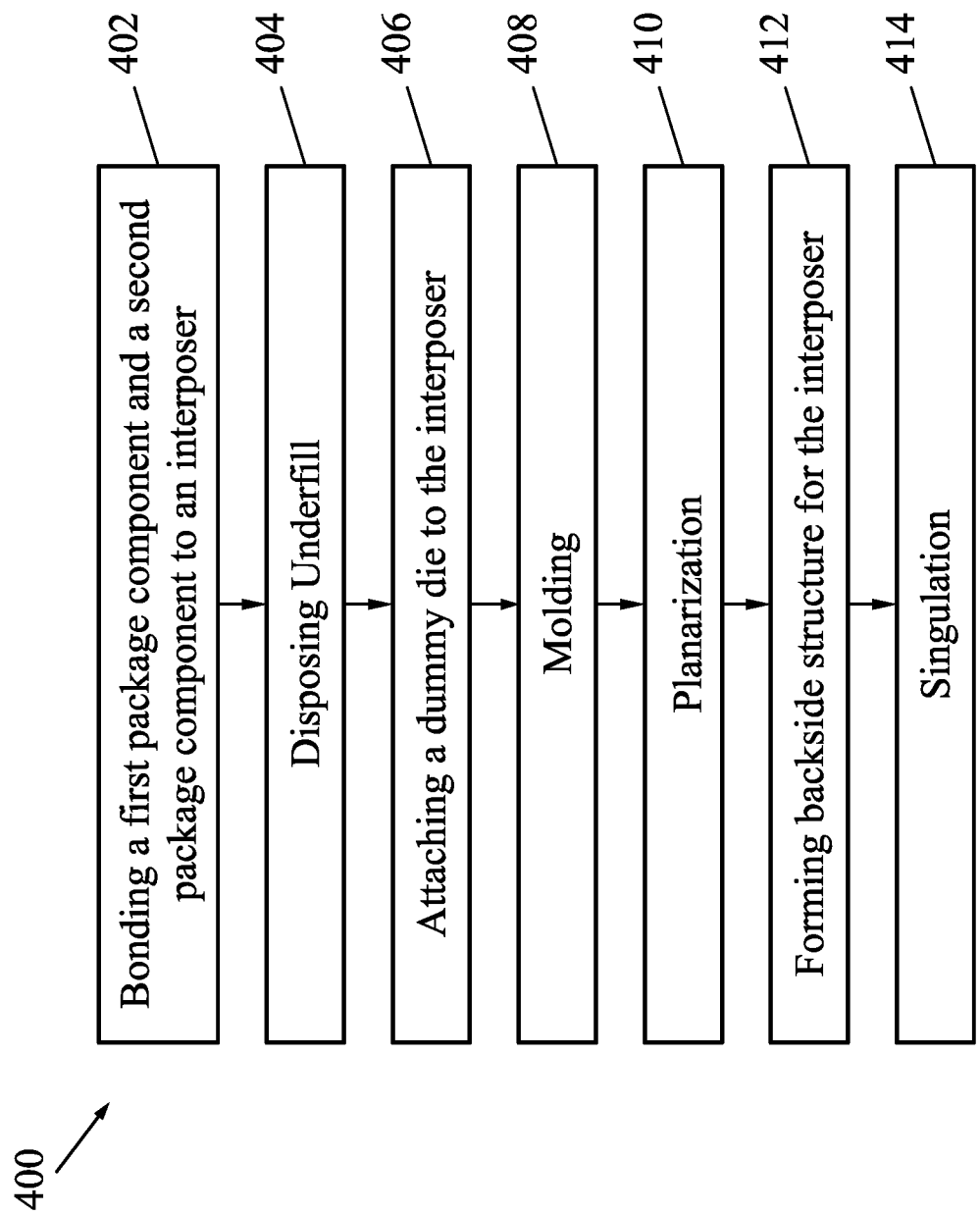
FIG. 23 illustrates a process flow for forming a package structure in accordance with some embodiments.

FIGS. 3-5 and 7-14 illustrate the cross-sectional views of intermediate stages in the packaging of package components and dummy dies, which are bonded to other package components. The respective processes are shown as process flow 400 as shown in FIG. 23. In FIGS. 3-5 and 7-14, interposers are used as an example of the package components 36, on which other package components are bonded thereon. It is appreciated that other types of package components such as package substrates (cored or coreless), packages, or the like, may also be used as package components 36.

Figure 3:
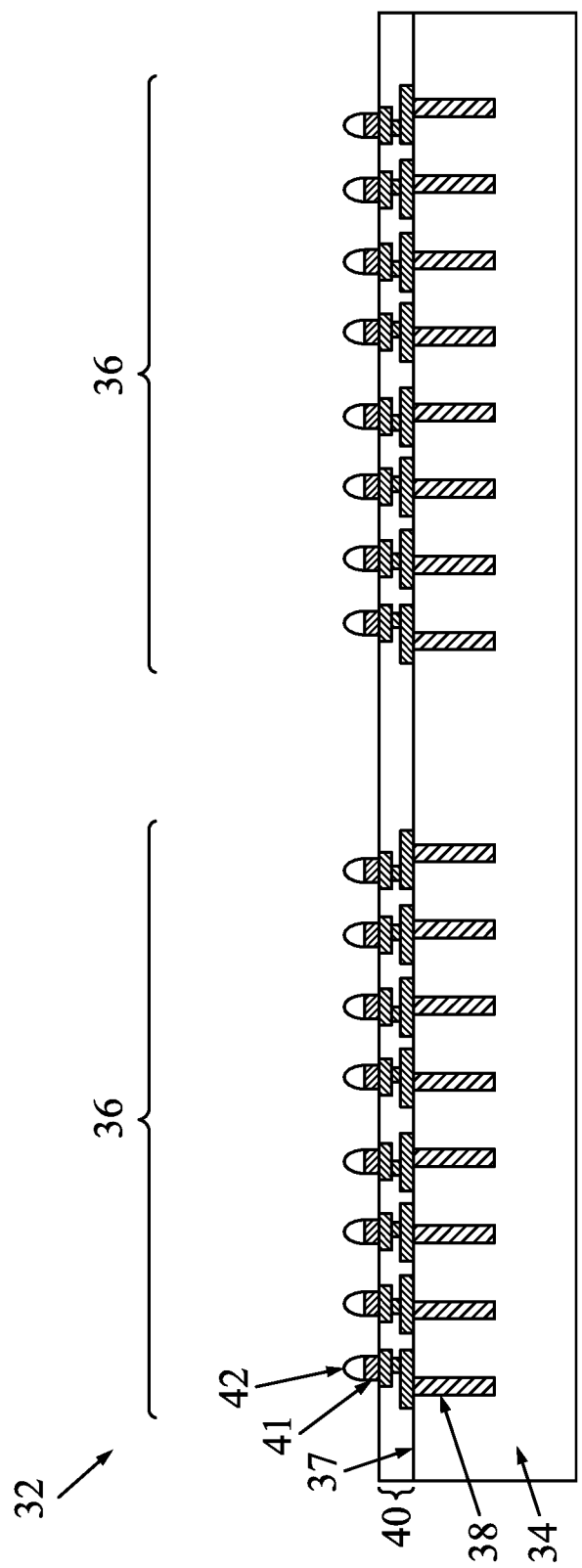

FIG. 3 illustrates package component 32 in accordance with some embodiments, which comprises one or more components 36 during processing. Package component 32 may be an interposer wafer, which is free from active devices (such as transistors and diodes) and passive devices (such as resistors, capacitors, inductors, or the like) therein. Package component 32 may also be a device wafer including active and/or passive devices. The substrate 34 may be a semiconductor substrate or a dielectric substrate. When being a semiconductor substrate, substrate 34 may be a bulk semiconductor substrate, a silicon-on-insulator (SOI) substrate, a multi-layered semiconductor substrate, or the like. The semiconductor material of the substrate 34 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 34 may be doped or undoped. Package component 32 may also be a package substrate, which may include a core or may be a core-less substrate.

Through-vias (TVs) 38 are formed to extend from a first surface 37 of substrate 34 into substrate 34. The TVs 38 are also sometimes referred to as through-substrate vias or through-silicon vias when substrate 34 is a silicon substrate. The TVs 38 may be formed by forming recesses in the substrate 34 by, for example, etching, milling, laser techniques, a combination thereof, and/or the like. A thin dielectric material may be formed in the recesses, such as by using an oxidation process or a conformal deposition process. A thin barrier layer may be conformally deposited over the front side of the substrate 34 and in the openings, such as by CVD, ALD, PVD, thermal oxidation, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess portions of conductive material and barrier layer are removed from the front side of the substrate 34 by, for example, CMP. Thus, the TVs 38 may comprise a conductive material and a thin barrier layer between the conductive material and the substrate 34.

Redistribution structure 40 is formed over the first surface 37 of the substrate 34, and is used to electrically connect the integrated circuit devices, if any, and/or TVs 38 together and/or to external devices. The redistribution structure 40 may include one or more dielectric layer(s) and respective metallization pattern(s) in the dielectric layer(s). The metallization patterns may comprise vias and/or traces to interconnect any devices and/or TVs 38 together and/or to an external device. The metallization patterns are sometimes referred to as Redistribution Lines (RDLs). The dielectric layers may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spin-on coating, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, or the like. Any excessive diffusion barrier layer and/or conductive material on the dielectric layer may be removed, for example, by using a CMP process.

Electrical connectors 41/42 are formed at the top surface of the redistribution structure 40 on conductive pads. In accordance with some embodiments, the conductive pads include under-bump-metallurgies (UBMs). In the illustrated embodiment, the pads are formed in openings of the dielectric layers of the redistribution structure 40. In another embodiment, the pads (UBMs) can extend through an opening of a dielectric layer of the redistribution structure 40 and also extend across the top surface of the redistribution structure 40.

In accordance with some embodiments, the electrical connectors 41/42 include a metal pillar 41 with a metal cap layer 42, which may be a solder cap, over the metal pillar 41. The electrical connectors 41/42 including the pillars 41 and the cap layers 42 are sometimes referred to as micro bumps 41/42. In accordance with some embodiments, the metal pillars 41 include a conductive material such as copper, aluminum, gold, nickel, palladium, the like, or a combination thereof and may be formed by sputtering, printing, electro plating, electroless plating, CVD, or the like. The metal pillars 41 may be solder-free and have substantially vertical sidewalls. In accordance with some embodiments, a metal cap layer 42 is formed on the top of the metal pillar 41. The metal cap layer 42 may include nickel, tin, tin-lead, gold, copper, silver, palladium, indium, nickel-palladium-gold, nickel-gold, the like, or a combination thereof and may be formed by a plating process.

Figure 4:
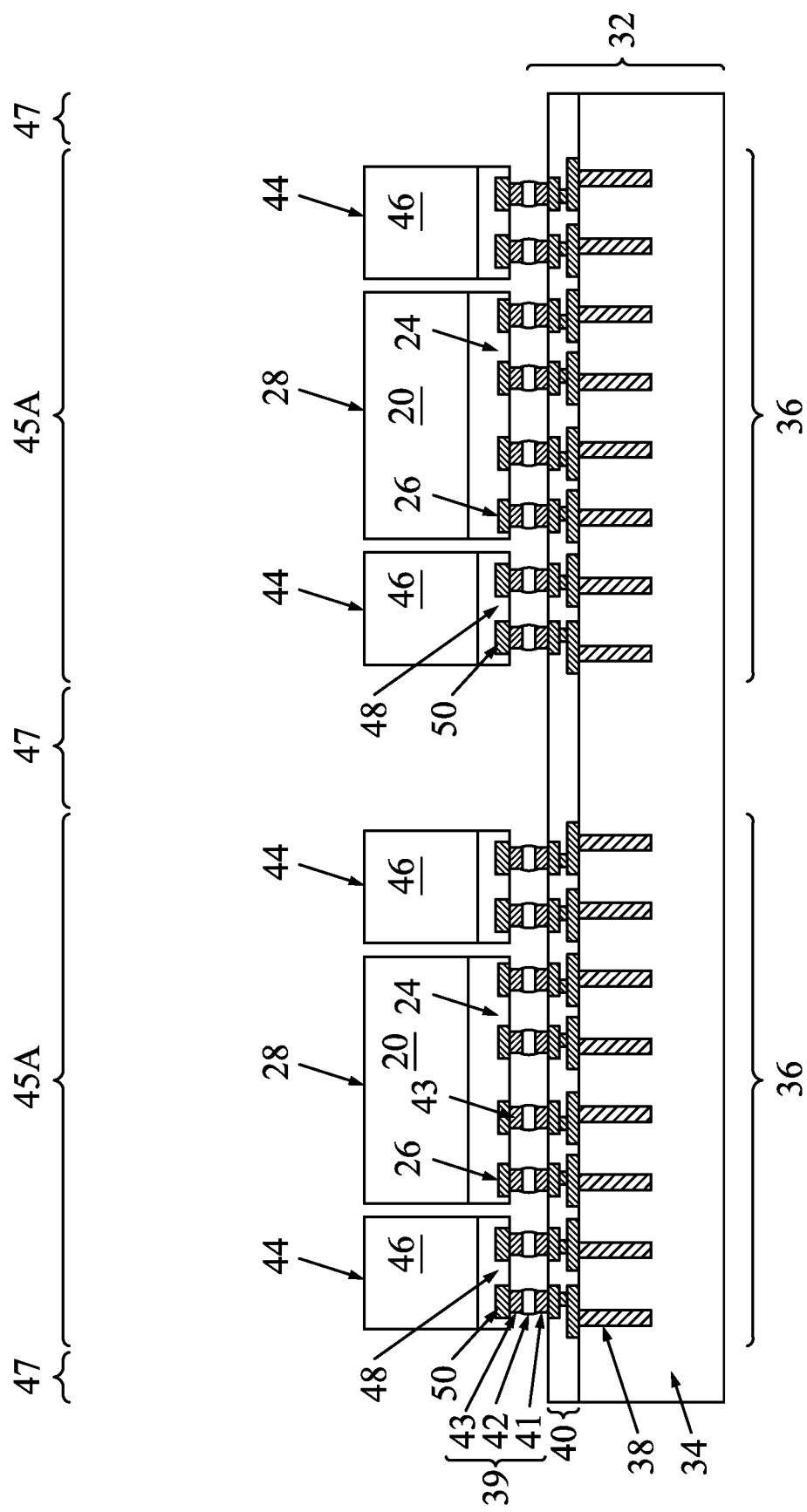

In FIG. 4, package components 28 and 44 are bonded to a first side of the components 36, for example, through flip-chip bonding by way of the electrical connectors 41/42 and the metal pillars 43 on the package components 28/44 to form conductive joints 39. The respective process is illustrated as process 402 in the process flow 400 shown in FIG. 23. The metal pillars 43 may be similar to the metal pillars 41 and the description is not repeated herein. The package components 28 and the package component 44 may be placed on the electrical connectors 41/42 using, for example, a pick-and-place tool.

The package component 44 may be formed through similar processing as described above in reference to package components 28. In accordance with some embodiments, the package component 44 include one or more memory dies, such as a stack of memory dies (e.g., DRAM dies, SRAM dies, High-Bandwidth Memory (HBM) dies, Hybrid Memory Cubes (HMC) dies, low-power (LP) double data rate (DDR) memory modules, or the like). In the stack of memory dies embodiments, a package component 44 can include both memory dies and a memory controller, such as, for example, a stack of four or eight memory dies with a memory controller. Also, in accordance with some embodiments, the package component 44 may be different sizes (e.g., different heights and/or surface areas), and in other embodiments, the package component 44 may be the same size (e.g., same heights and/or surface areas).

In accordance with some embodiments, the package component 44 may have similar heights as those of package components 28 (as shown in FIG. 4) or in accordance with some embodiments, package components 28 and 44 may be of different heights.

A package component 44 includes a main body 46, an interconnect structure 48, and electrical connectors 50. The main body 46 of the package component 44 may comprise any number of dies, substrates, transistors, active devices, passive devices, or the like. In an embodiment, the main body 46 may include a bulk semiconductor substrate, semiconductor-on-insulator (SOI) substrate, multi-layered semiconductor substrate, or the like. The semiconductor material of the main body 46 may be selected from the similar candidate materials and structure of substrate 20. Devices, such as transistors, capacitors, resistors, diodes, and the like, may be formed in and/or on an active surface.

An interconnect structure 48 comprising one or more dielectric layer(s) and respective metallization pattern(s) is formed on the active surface of the package component 44. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform electrical functions. Additionally, electrical connectors 50, such as conductive pillars (for example, comprising a metal such as copper), are formed in and/or on the interconnect structure 48 to provide an external electrical connection to the circuitry and devices. In accordance with some embodiments, the electrical connectors 50 protrude from the interconnect structure 48 to form pillar structure to be utilized when bonding the package component 44 to other structures. One of ordinary skill in the art will appreciate that the above examples are provided for illustrative purposes. Other circuitry may be used as appropriate for a given application.

The conductive joints 39 electrically couple the circuits in package components 28 and 44 through interconnect structures 48 and 24 and electrical connectors 50 and 26, respectively, to TVs 38 in components 36.

The bonding between package components 28 and 44 and the components 36 may be solder bonding or direct metal-to-metal (such as a copper-to-copper) bonding. In an embodiment, package components 28 and package component 44 are bonded to components 36 through a reflow process. During this reflow process, the electrical connectors 41/42/43 are in contact with the electrical connectors 26 and 50, respectively, and the pads of the redistribution structure 40 to physically and electrically couple the package components 28 and the package component 44 to the package components 36.

In FIG. 4 and subsequent figures, a first package region 45A and a second package region 45B for the formation of a first package and a second package, respectively, are illustrated. Scribe line regions 47 are between adjacent package regions. As illustrated in FIG. 4, a first die 28 and multiple second dies 44 are attached in each of the first package region 45A and the second package region 45B.

Figure 5:
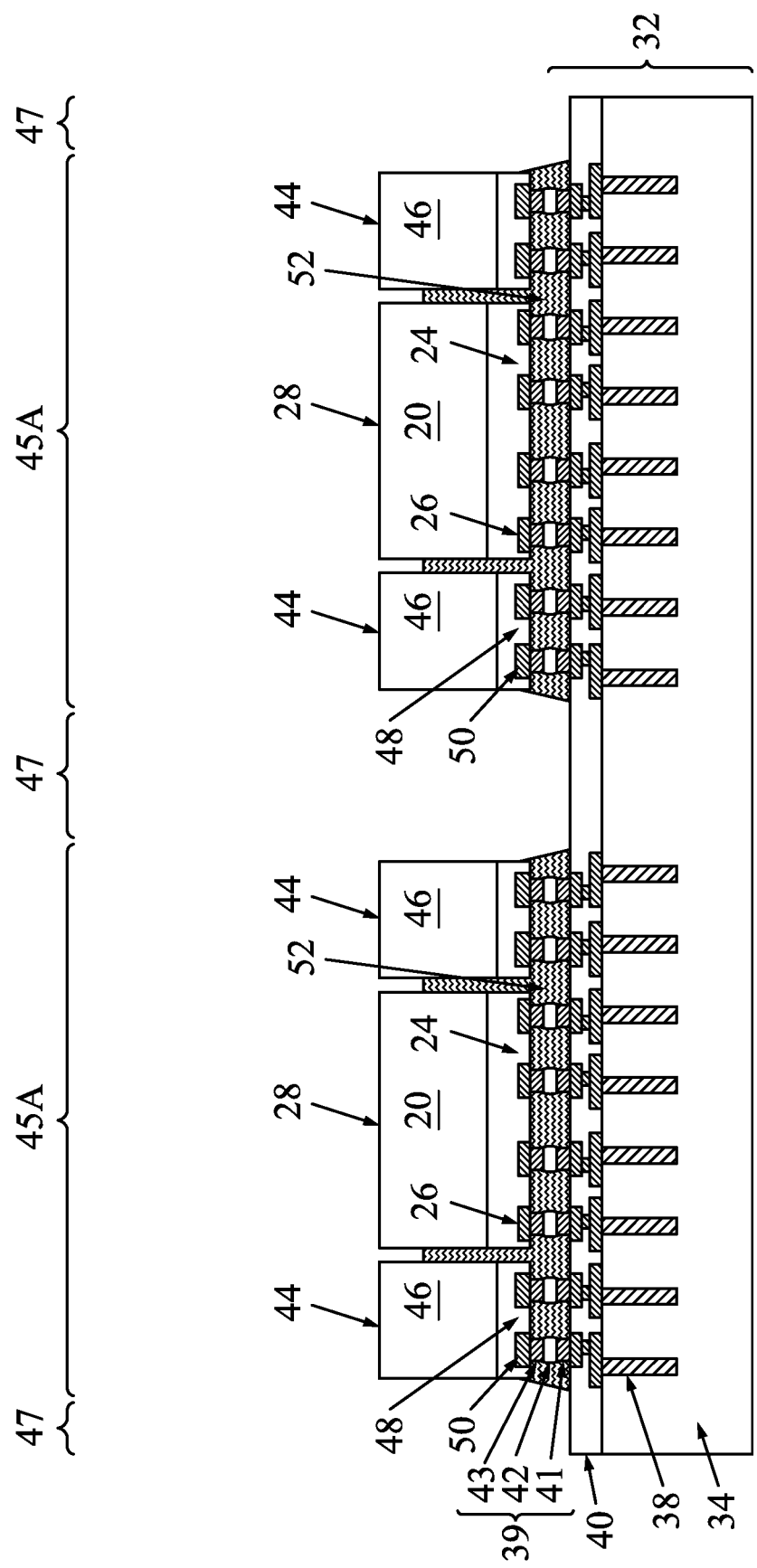

In FIG. 5, an underfill material 52 is dispensed into the gaps between package components 28/44, and the corresponding underlying portions of redistribution structure 40. The respective process is illustrated as process 404 in the process flow 400 shown in FIG. 23. The underfill material 52 may extend up along the sidewalls of package components 28 and the package component 44. The underfill material 52 may be any acceptable material, such as a polymer, epoxy, molding underfill, or the like. The underfill material 52 may be formed by a capillary flow process after package components 28 and 44 are attached.

FIGS. 6A, 6B, 6C, 6D, 6E, and 6F illustrate plan views of package structures including dummy dies 54 being adhered to the components 36. FIG. 7 is a cross-sectional view illustrating the dummy dies 54 in the package structure. FIG. 7 is along the line A-A of plan view FIG. 6C. The dummy dies 54 can be placed on the components 36 by using, for example, a pick-and-place tool. In FIGS. 6A, 6B, 6C, 6D, 6E, and 6F, "HBM" and "SOC" are marked as example package components 44 and 28, respectively. It is appreciated that package components 44 and 28 may be any other types of devices whenever applicable.

Figure 6A:
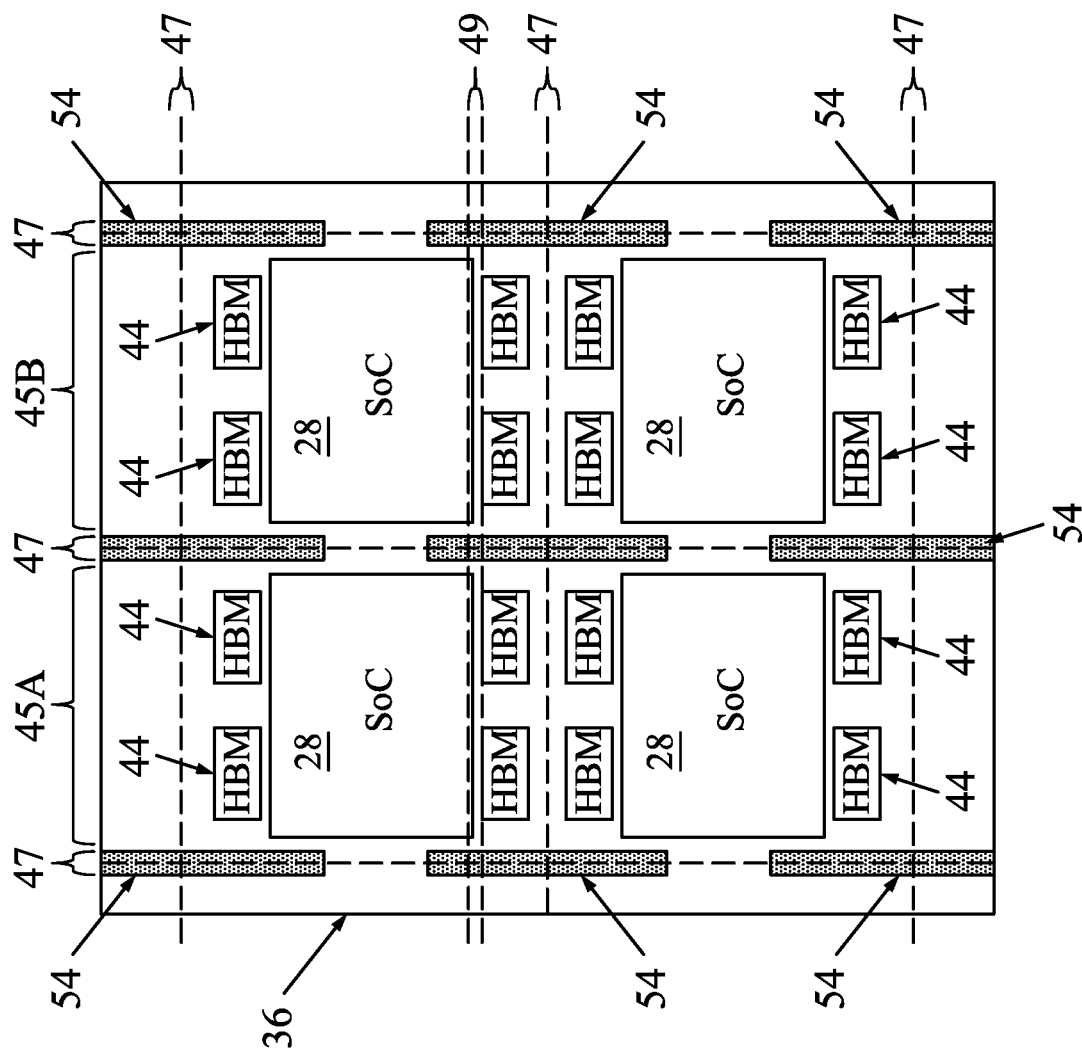
Figure 6B:
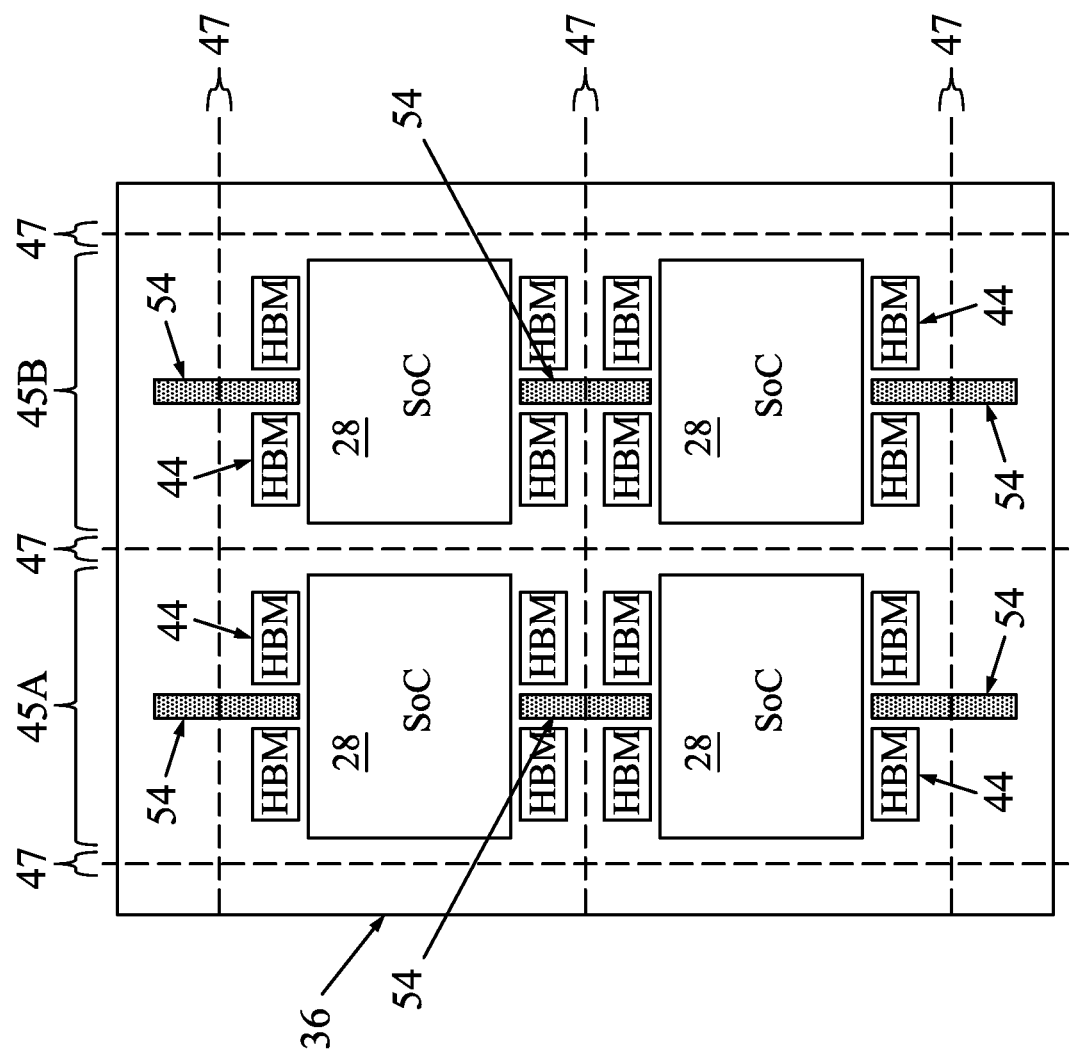
Figure 6C:
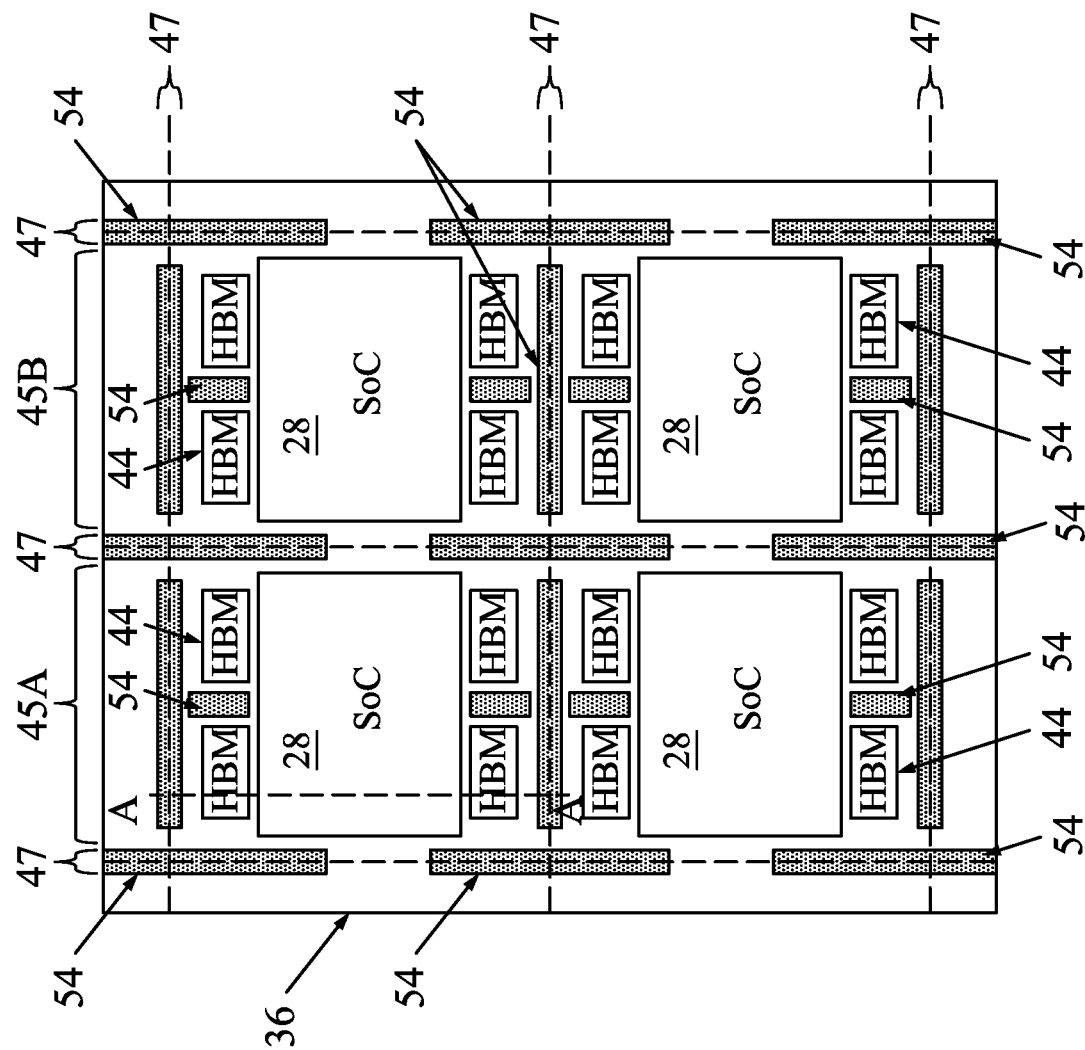
Figure 7:
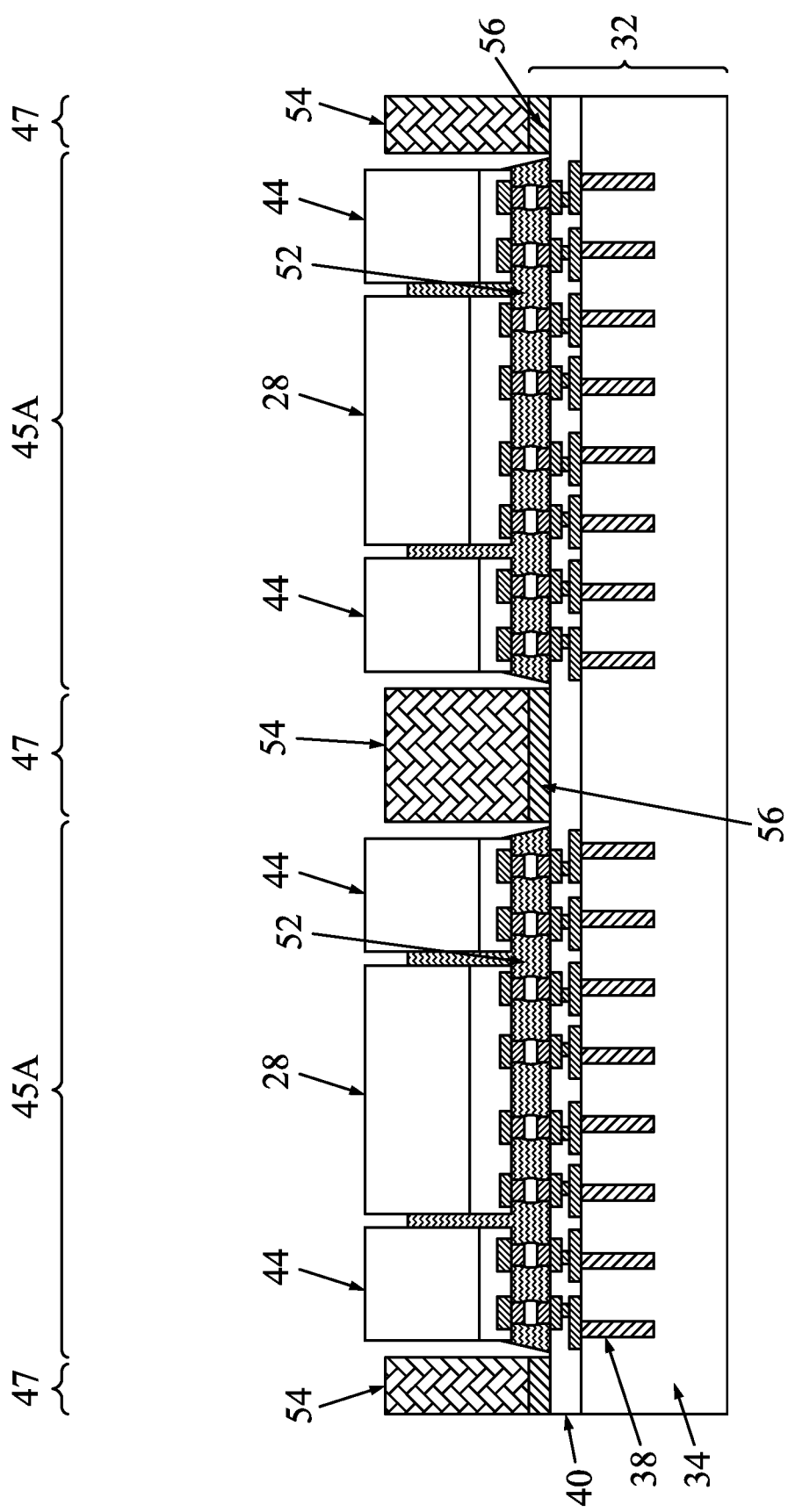

In FIG. 6A, the dummy dies 54 are attached in the scribe line regions 47 and have lengthwise directions extending along the scribe line regions 47 that are along a first direction (e.g. vertical direction of FIG. 6A). In FIG. 6B, the dummy dies 54 are attached between adjacent package component 44 of the same region 45A and/or 45B. In FIG. 6C, the dummy dies 54 are attached in the scribe line regions 47 and extend along the scribe line regions 47 that are along a first direction and second direction (e.g. both vertical and horizontal directions of FIG. 6C) and also interposed between adjacent package component 44 of the same region 45A and/or 45B.

Figure 6D:
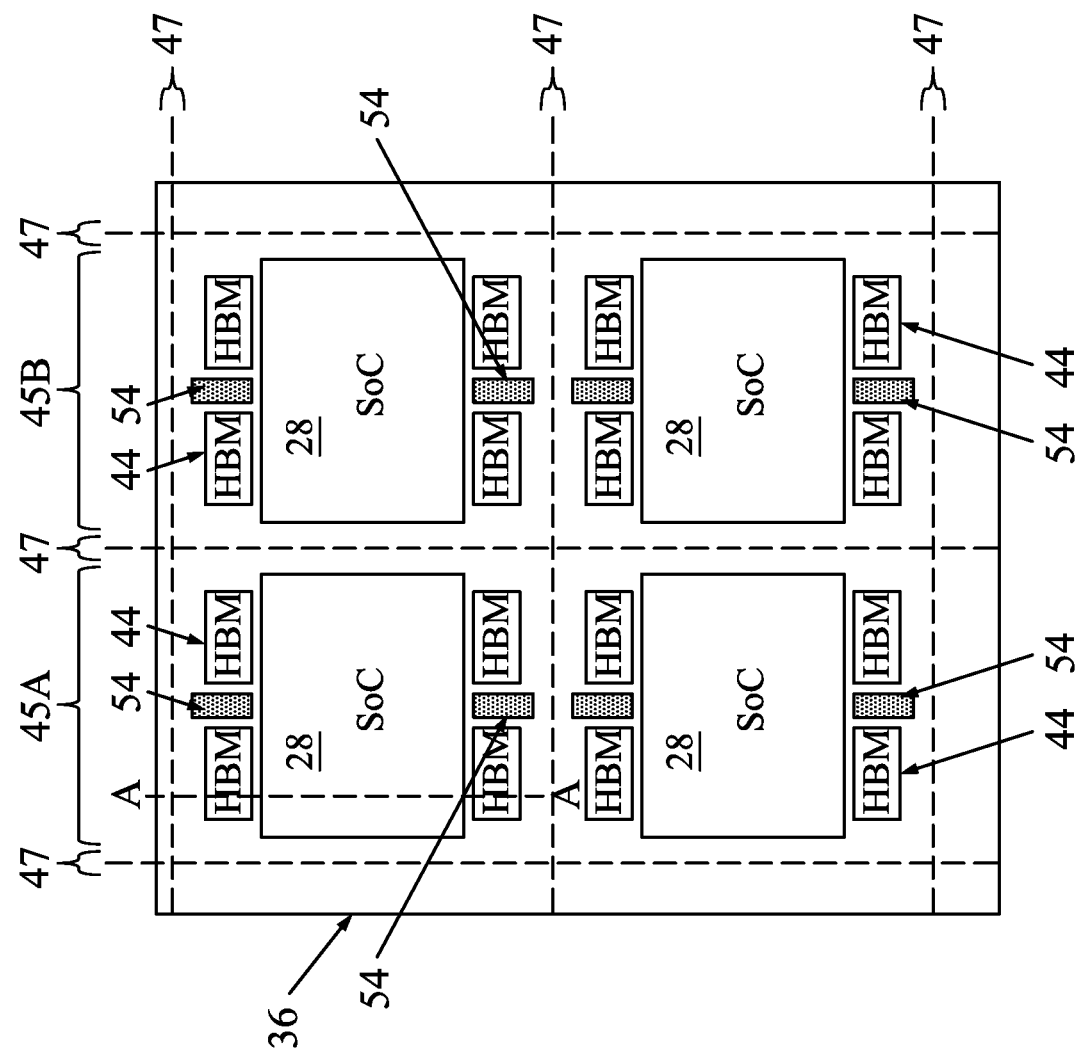
Figure 6E:
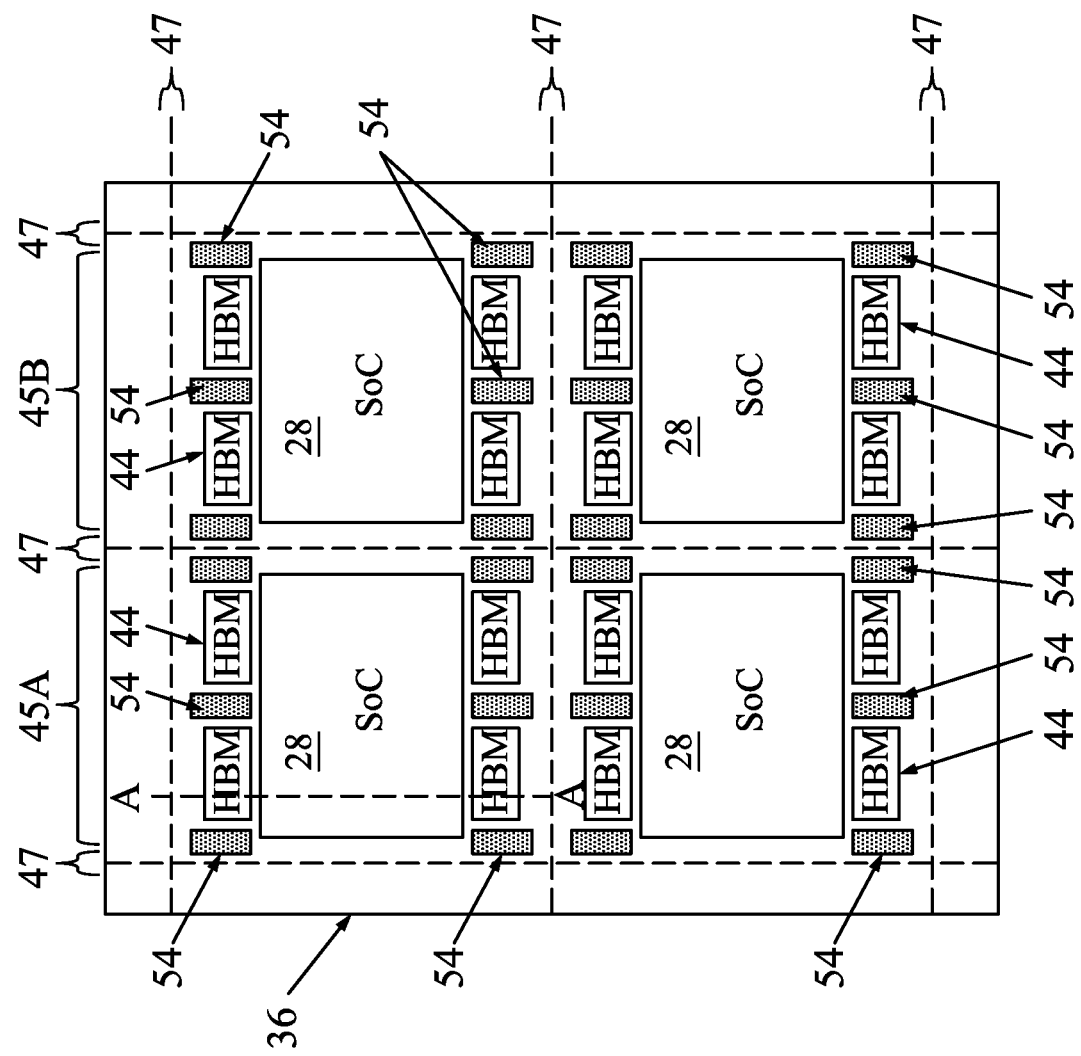
Figure 6F:
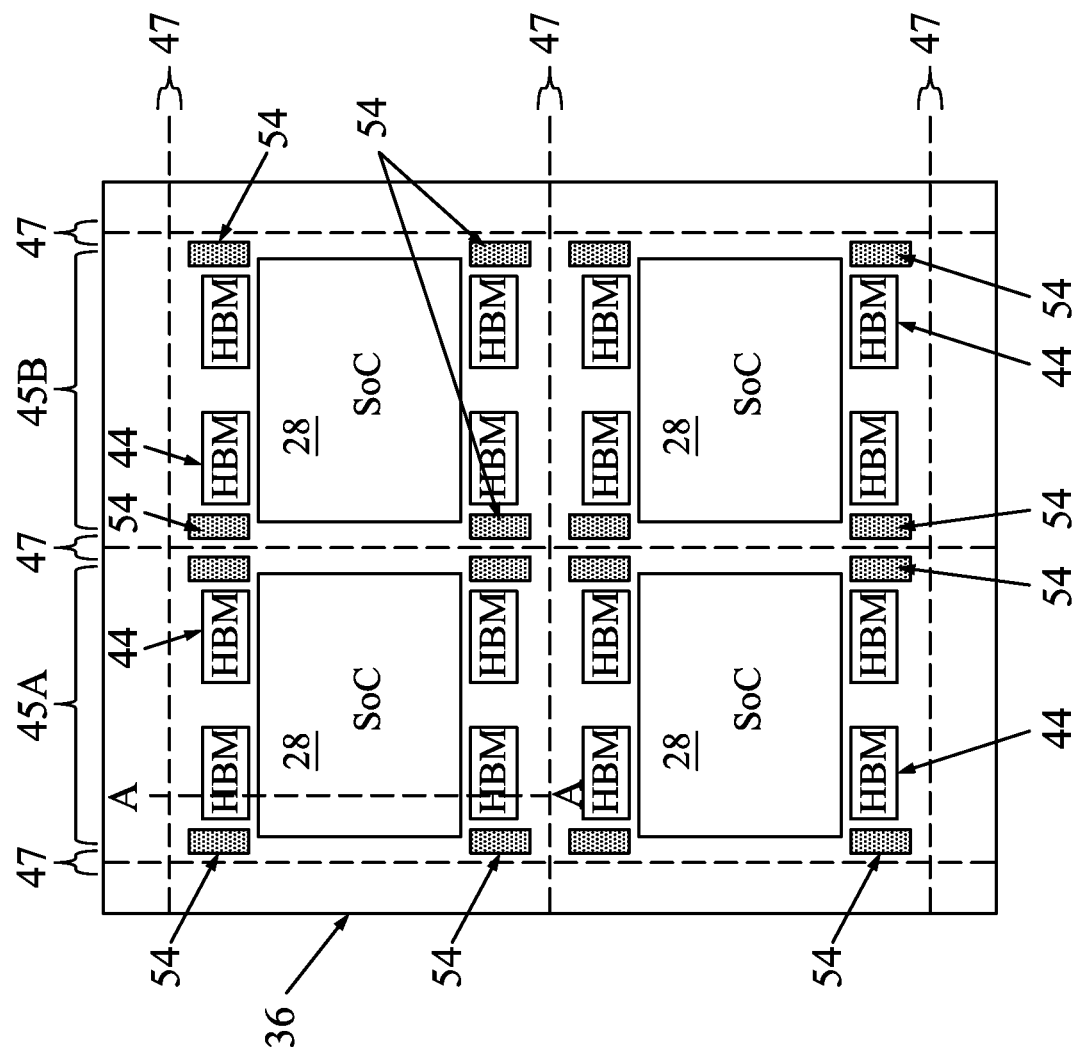

In FIG. 6D, the dummy dies 54 are attached between adjacent package component 44 of the same region 45A and/or 45B and are not in the scribe line regions 47 but are near the scribe line regions 47. In FIG. 6E, the configuration of dummy dies 54 is similar to the configuration of FIG. 6D, except that dummy dies 54 are also attached near the corners of the regions 45A and/or 45B adjacent the package component 44. Again, in this embodiment, the dummy dies 54 are not in the scribe line regions 47 but are near the scribe line regions 47. In FIG. 6F, the dummy dies 54 are attached near the corners of the regions 45A and/or 45B adjacent the package component 44 and are not in the scribe line regions 47 but are near the scribe line regions 47.

The dummy dies 54 being placed in or near the scribe line regions 47 can help to prevent warpage during and after singulation (see FIG. 13) of the packages in the first and second package regions 45A and 45B. A significant part of the warpage occur due to that there is a space 49 (FIG. 6A) between package components 44 and 28, in which molding compound will be filled. A dummy dies 54 (for example, FIG. 6A) includes a first portion in the space 49, and second portions on opposite sides of the first portion. Dummy dies 54 are rigid to prevent the warpage. For example, the embodiment of FIG. 6C (and singulated package in FIG. 15C discussed later) can reduce the warpage of the package by up to about 60% as compared to a package without any dummy dies 54.

One way the dummy dies 54 can help to reduce warpage is to provide support to the package during the actual singulation process. Another way that the dummy dies 54 can prevent warpage is to reduce the coefficient of thermal expansion (CTE) mismatch between the components 36 and the subsequently formed encapsulant 58 (see FIG. 8) as the dummy dies 54 have a similar CTE to the components 36 and they reduce the amount of encapsulant 58 necessary in the package.

Referring to FIG. 7, dummy dies 54 are adhered in the scribe line regions 47 adjacent the package component 44. The respective process is illustrated as process 406 in the process flow 400 shown in FIG. 23. The dummy dies 54 are attached to the components 36 with attaching structures 56. In accordance with some embodiments, the attaching structures 56 are adhesives that adhere the dummy dies 54 to the corresponding components 36. In accordance with some embodiments, the attaching structure 56 includes one or more metal pillars with metal cap layers (sometimes referred to as micro bumps) that bond the dummy dies 54 to the components. The dummy dies 54 may be made of silicon, a dielectric material, the like, or a combination thereof. In accordance with some embodiments, the dummy dies 54 are blank dies, with the entirety formed of a homogeneous material such as silicon. No active devices, passive devices, metal features, or the like are formed in dummy dies 54 in accordance with some embodiments. Dummy dies 54 do not have electrical functions. In accordance with some embodiments, the dummy dies 54 are defective active dies that have been recycled as dummy dies 54. In accordance with some embodiments, the top surfaces of the dummy dies 54 are lower than the back sides of either one or both of package components 28 and 44.

In the adhesive attaching structure 56 embodiments, the adhesive 56 is on bottom surfaces of the dummy dies 54 and adheres the dummy dies 54 to the components 36, such as the redistribution structure 40 in the illustration. The adhesive 56 may be any suitable adhesive, epoxy, die attach film (DAF), or the like. The adhesive 56 may be applied to a bottom surface of the dummy dies 54 or may be applied over the surface of the redistribution structure 40. The dummy dies 54 may be adhered to the redistribution structure 40 by the adhesive 56 using, for example, a pick-and-place tool. Underfill 52 is disposed, and is then cured, either before or after the dummy dies 54 are adhered.

In the micro bump attaching structure 56 embodiments, the micro bumps 56 are formed on bottom surfaces of the dummy dies 54, the top surfaces of the components 36, or both. The micro bumps 56 can be formed at a same time as micro bumps (e.g. electrical connectors 41/42) that bond package components 28 and 44. The micro bumps 56 bond the dummy dies 54 to the components 36, such as the redistribution structure 40 in the illustration. The micro bumps 56 of the dummy dies 54 can be reflowed together with the electrical connectors 41/42/43 of package components 28 and 44.

Figure 8:
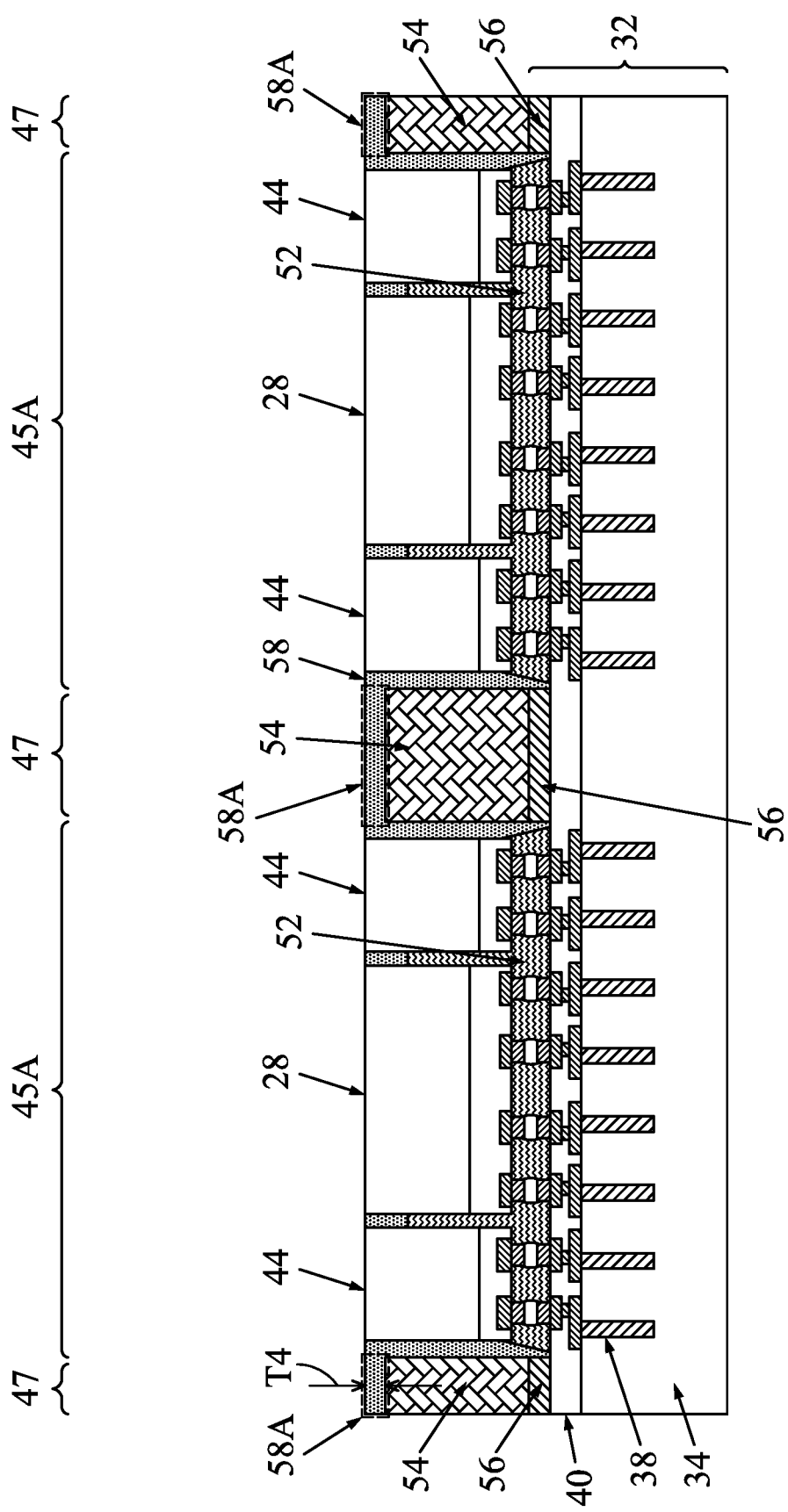

In FIG. 8, an encapsulant 58 is disposed/molded to encapsulate package components 28 and 44 and dummy dies 54 therein. The respective process is illustrated as process 408 in the process flow 400 shown in FIG. 23. The encapsulant 58 may be a molding compound, epoxy, or the like, and may be applied by compression molding, transfer molding, or the like. Encapsulant 58 and underfill 52 may be formed of different materials. A curing process is performed to cure the encapsulant 58, such as a thermal curing, an Ultra-Violet (UV) curing, or the like. In accordance with some embodiments, the package components 28, the package component 44, and the dummy dies 54 are buried in the encapsulant 58. After the curing of the encapsulant 58, a planarization process such as a Chemical Mechanical Polish (CMP) process or a mechanical grinding process may be performed to remove excess portions of the encapsulant 58, which excess portions are over top surfaces of package components 28 and/or package component 44. The respective process is illustrated as process 410 in the process flow 400 shown in FIG. 23. Accordingly, the top surfaces of package components 28 and/or package components 44 are exposed, and are level with a top surface of the encapsulant 58.

Figure 13:
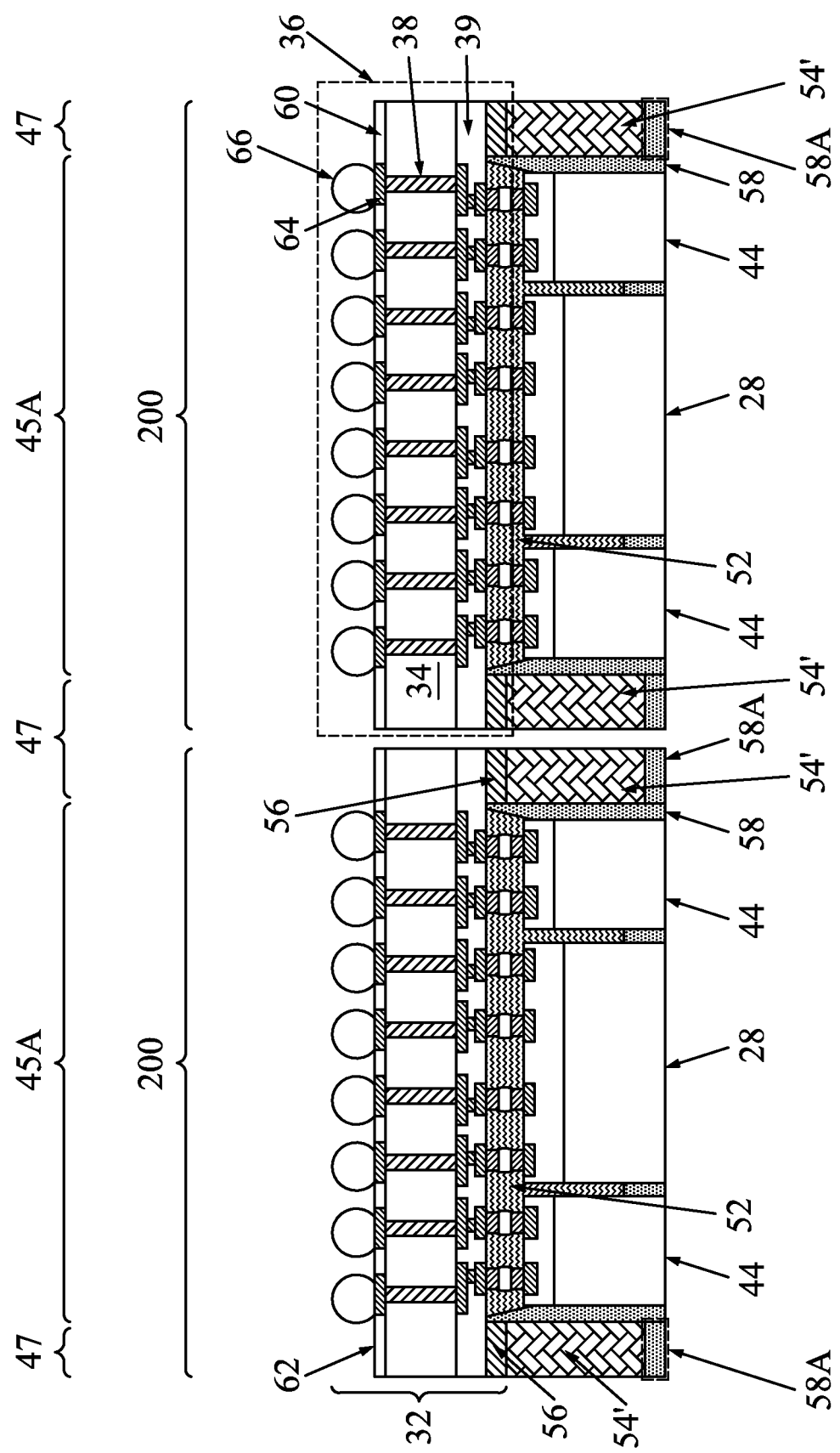

In accordance with some embodiments of the present disclosure, the top surfaces of dummy dies 54 are lower than the top surface of encapsulant 58. Accordingly, portions 58A of encapsulant 58 cover dummy dies 54. The thickness T4 of portions 58A is great enough to provide adequate protection to dummy dies 54 from the undesirably chipping in the subsequent singulation process as shown in FIG. 13. Otherwise, if thickness T4 is too small, in the subsequent singulation process, portions 58A may chip or peel from dummy dies 54. Thickness T4 also cannot be too big either. Otherwise, dummy dies 54 will be thin, and their ability to prevent the warpage of the resulting package is compromised. In accordance with some embodiments, thickness T4 is greater than about 5 µm, and may be in the range between about 5 µm and about 600 µm.

Figure 9:
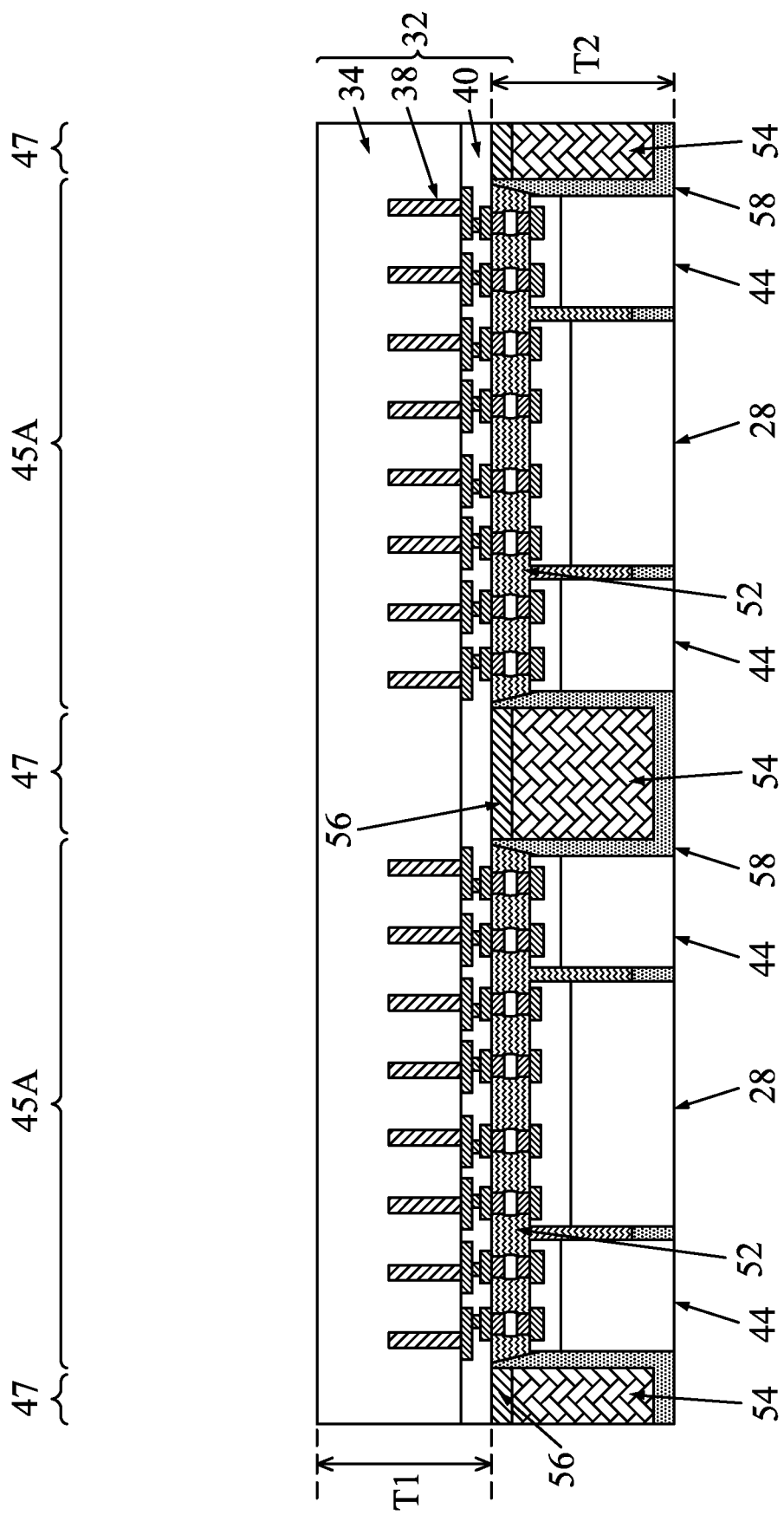

FIGS. 9 through 12 illustrate the formation of the structure on the second side of components 36. The respective process is illustrated as process 412 in the process flow 400 shown in FIG. 23. In FIG. 9, the structure of FIG. 8 is flipped over to prepare for the formation of the second side of components 36. Although not shown, the structure may be placed on a carrier or a support structure (not shown) for the processes of FIGS. 9 through 12. As shown in FIG. 9, at this stage of processing, the substrate 34 and redistribution structure 40 of the components 36 have a combined thickness T1 in a range between about 50 µm and about 415 µm, such as about 415 µm. The dummy dies 54 (including attaching structure 56) have a thickness T2 in a range from about 30 µm to about 415 µm, such as about 400 µm.

Figure 10:
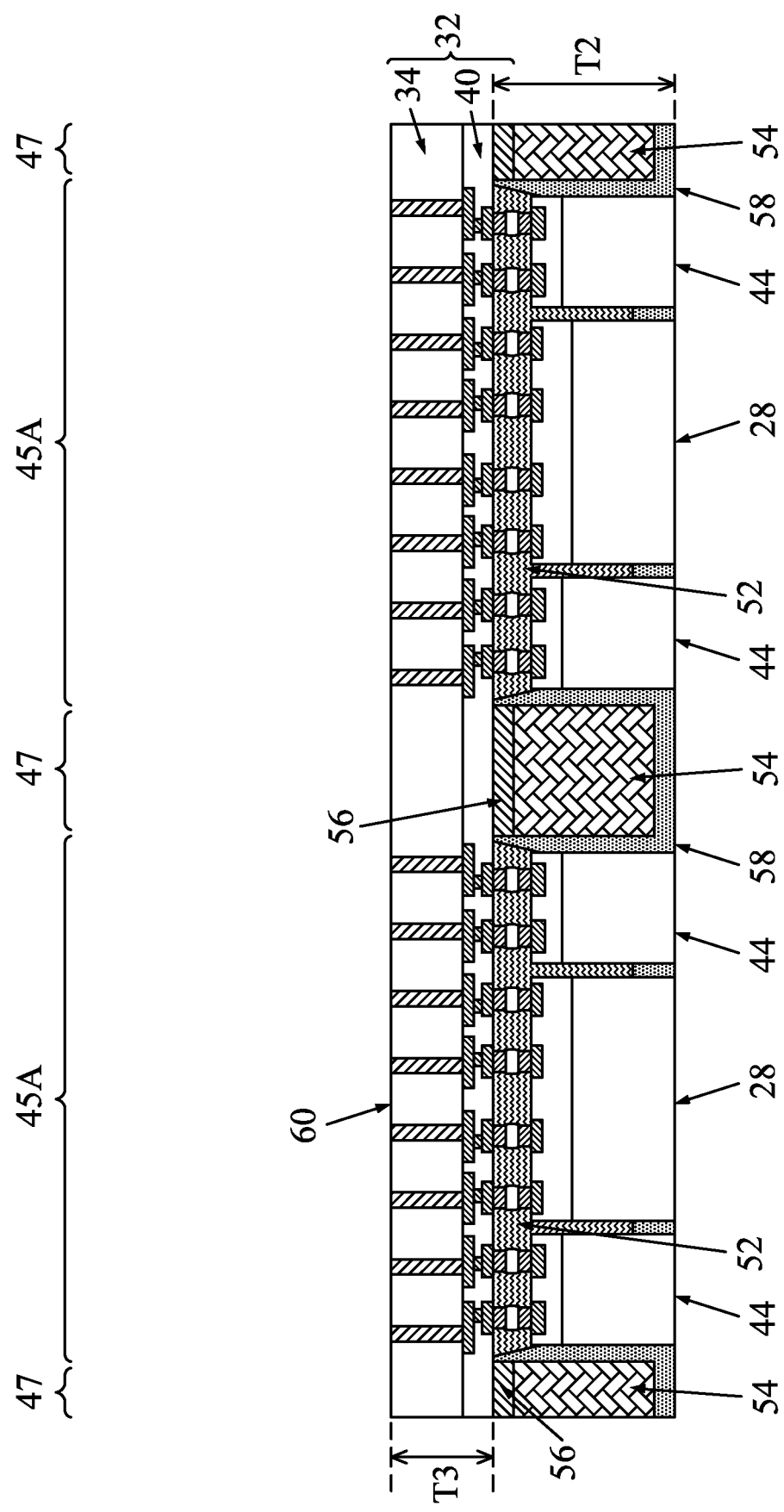

In FIG. 10, a thinning process is performed on the second side of the substrate 34 to thin the substrate 34 to a second surface 60 until TVs 38 are exposed. The thinning process may include an etch-back process, a grinding process, the like, or a combination thereof. In accordance with some embodiments, after the thinning process, the substrate 34 and redistribution structure 40 of the components 36 have a combined thickness T3 in a range between about 30 µm and about 200 µm, such as about 52 µm.

Figure 11:
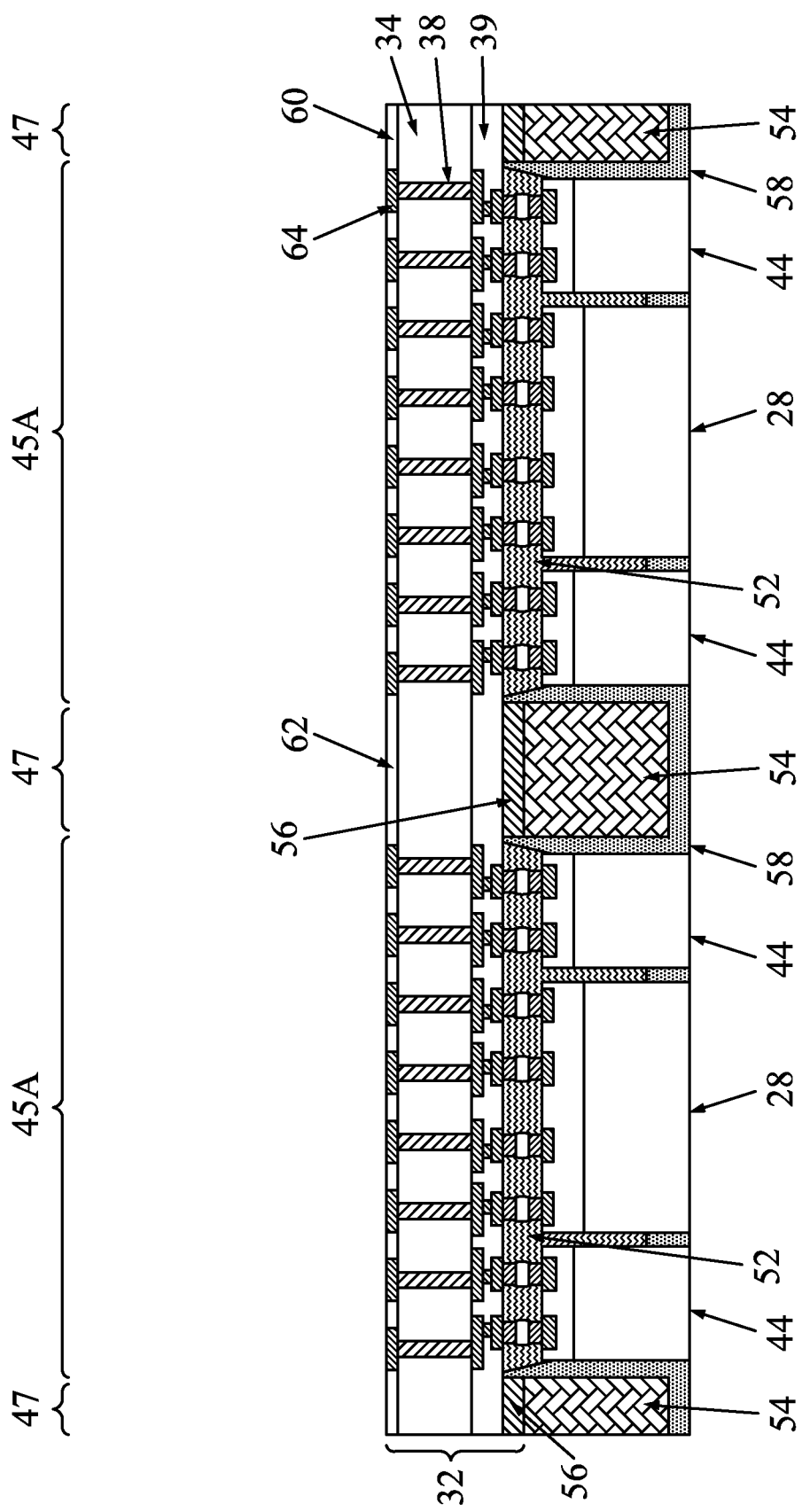

In FIG. 11, a redistribution structure is formed on the second surface 60 of the substrate 34, and is used to electrically connect the TVs 38 together and/or to external devices. The redistribution structure includes one or more dielectric layers 62 and metallization patterns 64 in the one or more dielectric layers 62. The metallization patterns may comprise vias and/or traces to interconnect TVs 38 together and/or to an external device. The metallization patterns 64 are sometimes referred to as Redistribution Lines (RDLs). The dielectric layers 62 may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers 62 may be deposited by any suitable method known in the art, such as spinning, CVD, PECVD, HDP-CVD, or the like. The metallization patterns 64 may be formed in the dielectric layer 62, for example, by using damascene processes.

Figure 12:
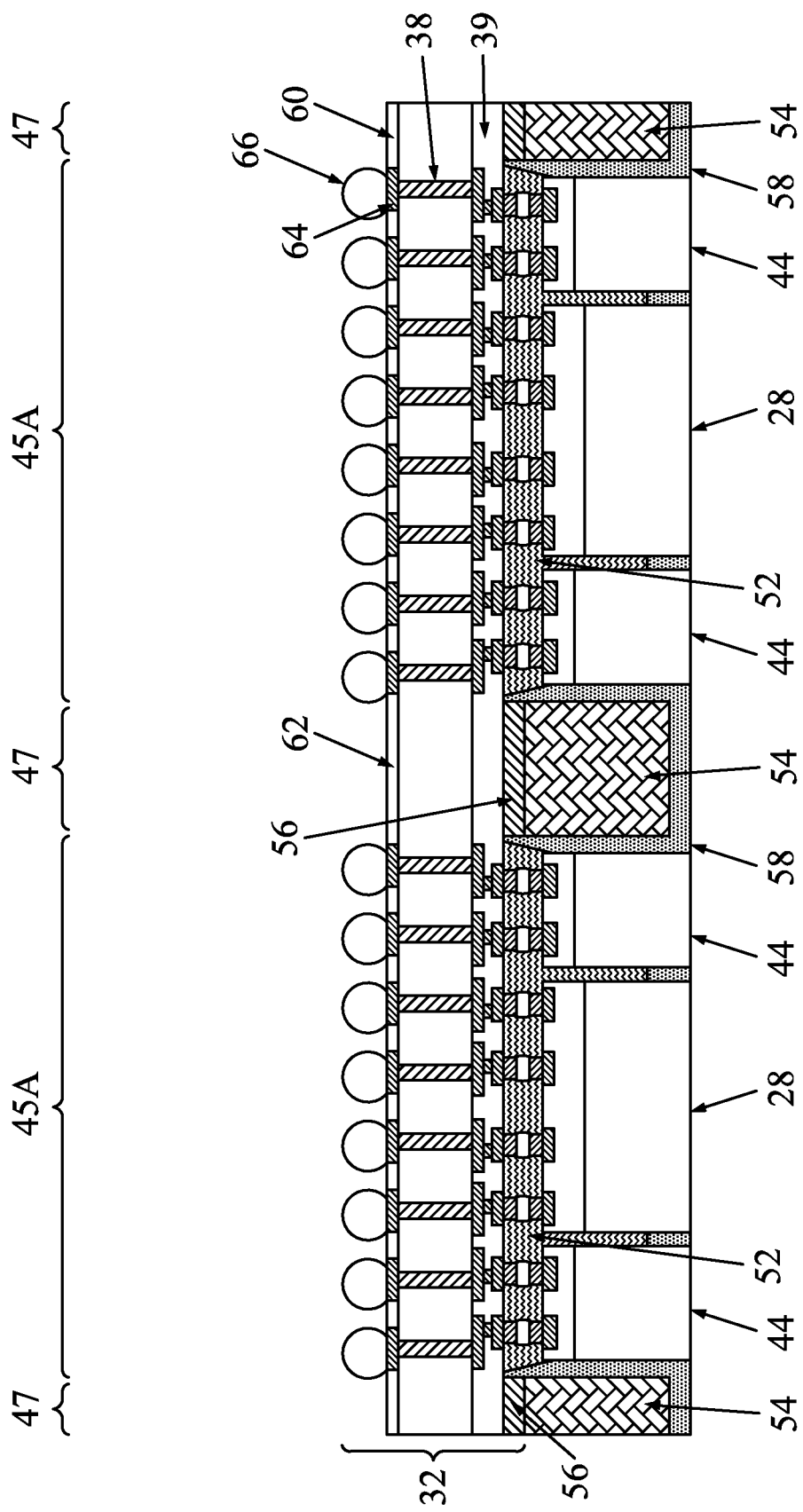

In FIG. 12, electrical connectors 66 are also formed on the metallization patterns 64 and are electrically coupled to TVs 38. The electrical connectors 66 are formed at the top surface of the redistribution structure on the metallization patterns 64. In accordance with some embodiments, the metallization patterns 64 include UBMs. In the illustrated embodiment, the pads are formed in openings of the dielectric layers 62 of the redistribution structure. In another embodiment, the pads (UBMs) can extend through an opening of a dielectric layer 62 of the redistribution structure and also extend across the top surface of the redistribution structure.

In accordance with some embodiments, the electrical connectors 66 are solder balls and/or metal bumps, such as ball grid array (BGA) balls, C4 micro bumps, ENIG formed bumps, ENEPIG formed bumps, or the like. The electrical connectors 66 may include a conductive material such as solder, copper, aluminum, gold, nickel, silver, palladium, tin, the like, or a combination thereof. In another embodiment, the electrical connectors 66 are metal pillars (such as a copper pillar) formed by a sputtering, printing, electro plating, electroless plating, CVD, or the like. The metal pillars may be solder free and have substantially vertical sidewalls. In accordance with some embodiments, a metal cap layer (not shown) is formed on the top of the metal pillar connectors 66. The metal cap layer may include nickel, tin, tin-lead, gold, silver, palladium, indium, nickel-palladium-gold, nickel-gold, the like, or a combination thereof and may be formed by a plating process.

Figure 14:
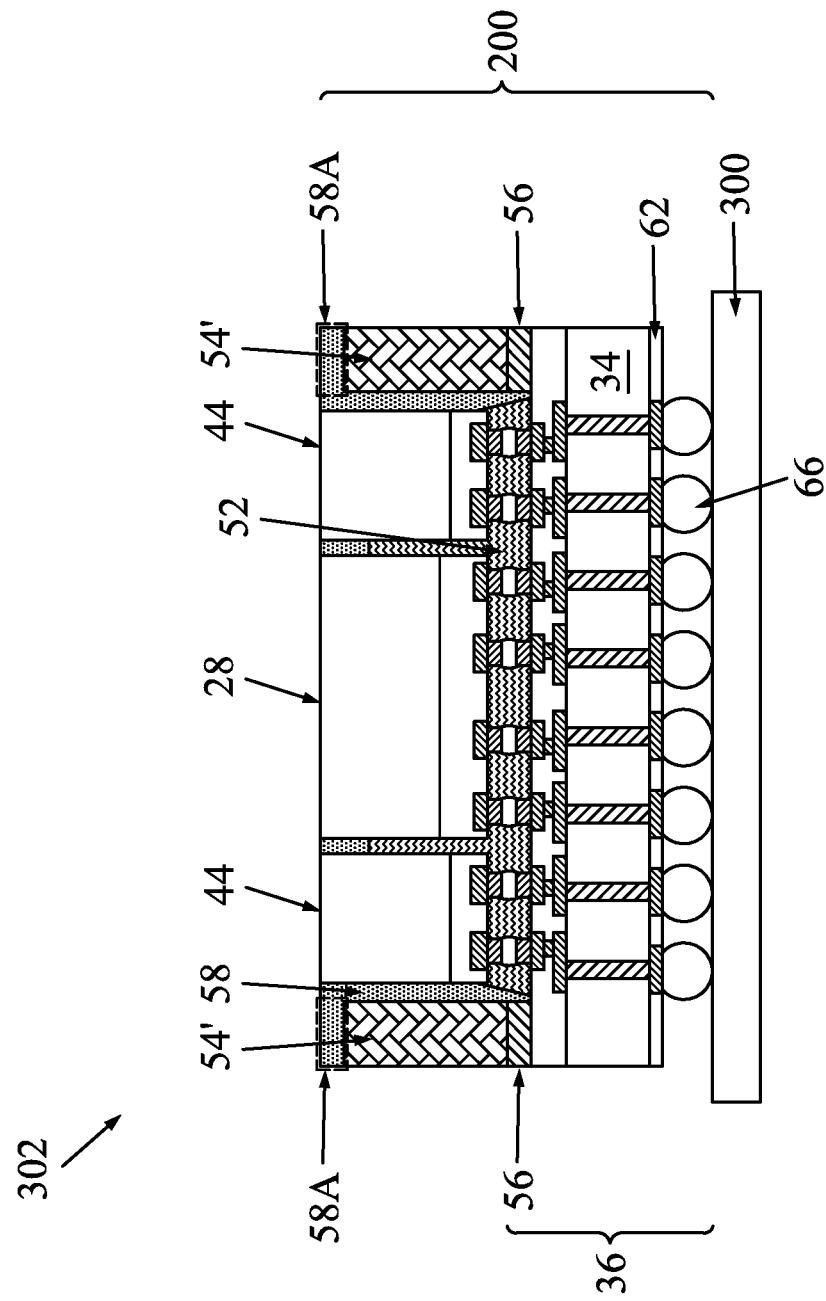

The electrical connectors 66 may be used to bond to an additional electrical component, which may be a semiconductor substrate, a package substrate, a Printed Circuit Board (PCB), or the like (see 300 in FIG. 14).

In FIG. 13, components 36 and dummy dies 54 are singulated between adjacent regions 45A and 45B along scribe line regions 47 to form component packages 200. The respective process is illustrated as process 414 in the process flow 400 shown in FIG. 23. Each component package 200 comprises, among other features, package component 28, package component 36, package component 44, and remaining portions 54' of the dummy dies 54. The singulation may be by sawing, dicing, or the like, and may be performed using a blade. Each of dummy dies 54 may have portions 54' left on opposite sides of the respective kerf. As discussed above, the remaining dummy die portions 54' help to reduce the stress and warpage caused during and after the singulation process. Encapsulant portion 58A, which covers dummy die 54, prevents dummy die 54 from chipping during the singulation process. Otherwise, if portion 58A is not formed, dummy die 54 may chip due to the mechanical force of the dicing blade.

After the singulation process, the remaining portions 54' of the dummy dies 54 have sidewall surfaces that are coterminous with (flush with) the lateral extents of the component package 200 (see, e.g., FIGS. 13 and 14).

FIG. 14 illustrates the attachment of a component package 200 on a package component 300 to form package 302. Electrical connectors 66 are aligned to, and are put against, bond pads of the package component 300. The electrical connectors 66 may be reflowed to create a bond between the package component 300 and the component 36. The package component 300 may comprise a package substrate, such as a build-up substrate including a core therein, a laminate substrate including a plurality of laminated dielectric films, a printed circuit board (PCB), or the like. The package component 300 may comprise electrical connectors (not shown), such as solder balls, opposite the component package to allow the package component 300 to be mounted to another device. An underfill material (not shown) can be dispensed between the component package 200 and the package component 300 and surrounding the electrical connectors 66. The underfill material may be any acceptable material, such as a polymer, epoxy, molding underfill, or the like.

FIGS. 15 through 19 illustrate the plane view and cross-sectional views of intermediate stages in the formation of a package structure in accordance with some embodiments of the present disclosure. Unless specified otherwise, the materials and the formation processes of the components in these embodiments are essentially the same as the like components, which are denoted by like reference numerals in the embodiments shown in FIGS. 1-5, 6A, 6B, 6C, 6D, 6E, 6F, and 7-14. The details regarding the formation processes and the materials of the components shown in FIGS. 15 through 19 may thus be found in the discussion of the embodiment shown in FIGS. 1-5, 6A, 6B, 6C, 6D, 6E, 6F, and 7-14. The initial steps of these embodiments are essentially the same as shown in FIGS. 1-5, 6A, 6B, 6C, 6D, 6E, and 6F.

Figure 15:
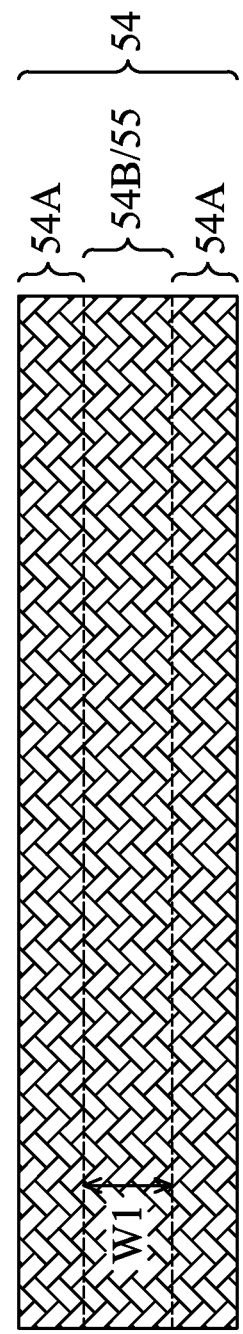
FIGS. 15 through 19 are cross-sectional views and plan views in an example process of forming a package structure in accordance with some embodiments.
Figure 16:
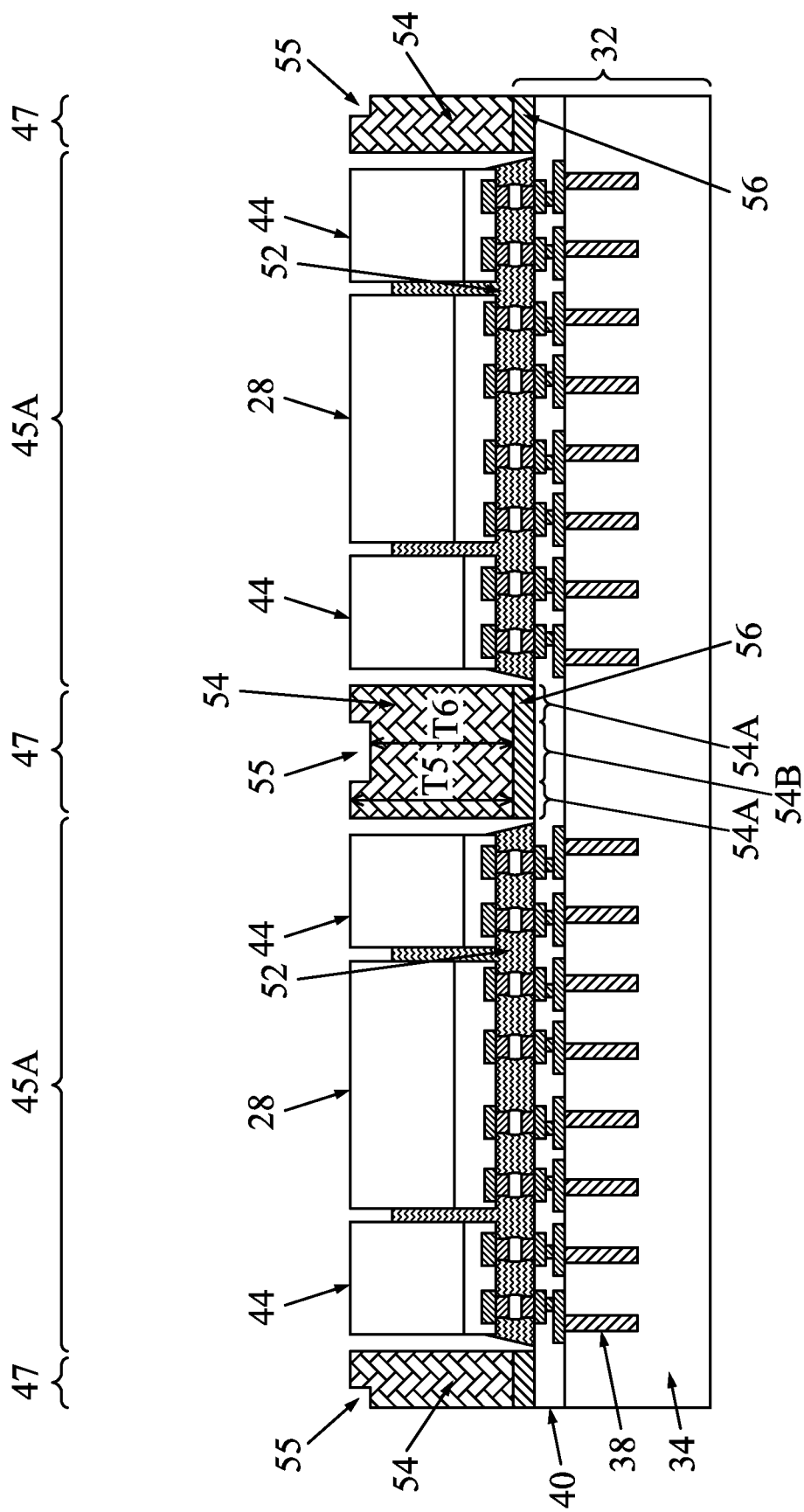

FIG. 15 illustrates a plane view of dummy die 54 in accordance with some embodiments. Dummy die 54 includes portion 54B, and portions 54A on opposite sides of dummy die portion 54B. Dummy die portions 54A are thicker than portion 54B, hence forming recess 55 over dummy die portion 54B, as shown in FIG. 16. For example, as shown in FIG. 16, dummy die portions 54A have thickness T5, and dummy die portion 54B has thickness T6 smaller than thickness T5, resulting in recess 55 extending into dummy die 54. In accordance with some embodiments, the difference (T5-T6) is greater than about 5 μm, and may be in the range between about 5 μm and about 600 μm. Width W1 (FIG. 15) of portion 54B is greater than the kerf of the singulation process (FIG. 13) with adequate process margin. Furthermore, width W1 is large enough, so that there are remaining portions 54B left on opposite sides of the kerf after the singulation. Width W1 may be greater than about 30 μm, and may be in the range between about 50 μm and about 1,000 μm.

Referring to FIG. 16, dummy dies 54 are attached to package component 32. In accordance with some embodiments, dummy die portion 54B is in the middle of scribe line 47, and one of dummy die portion 54A is between dummy die portion 54B and region 45A, and the other one of dummy die portion 54A is between dummy die portion 54B and region 45B.

Figure 17:
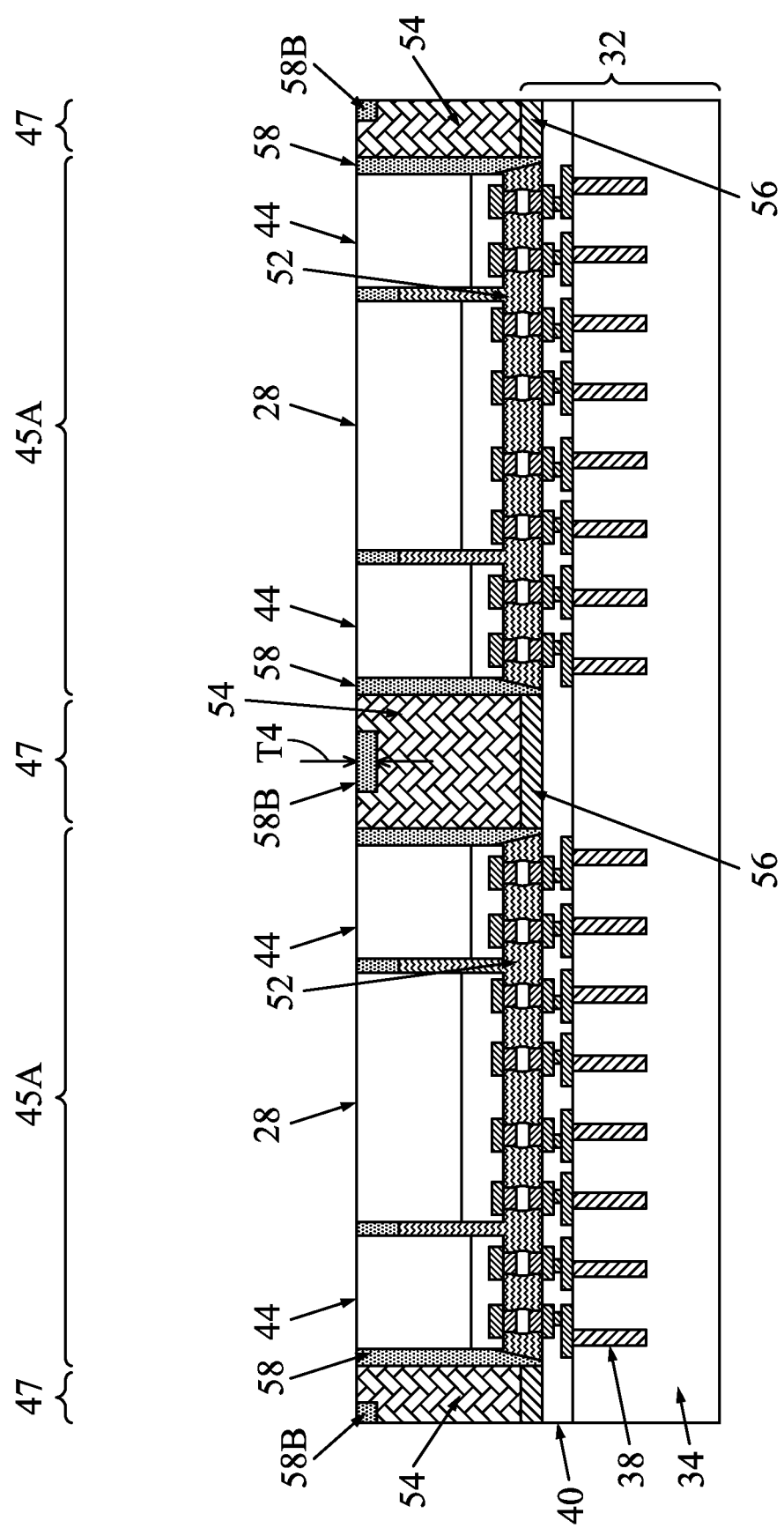

FIG. 17 further illustrates the encapsulation with encapsulant 58. In accordance with some embodiments, encapsulant 58 is disposed into the gaps between package components 28 and 44 and dummy die 54. Also, encapsulant 58 is disposed into recesses 55 in dummy dies 54. A planarization process is then performed to remove excess encapsulant 58. After the planarization, encapsulant portions 58B of encapsulant 58 remain in recesses 55, and have thickness T4, which may be greater than about 5 μm, and may be in the range between about 5 μm and about 600 μm.

Figure 18:
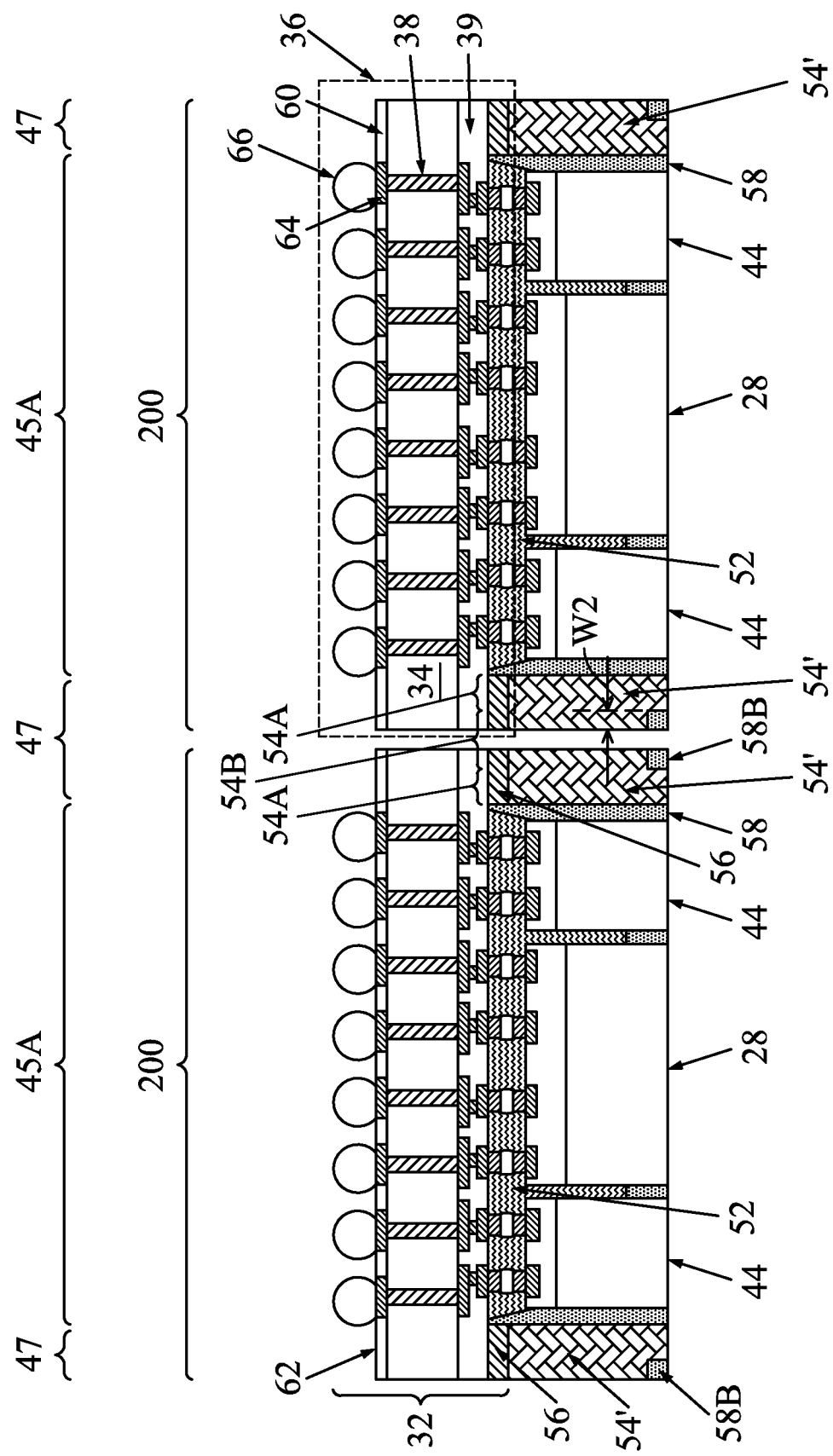
Figure 19:
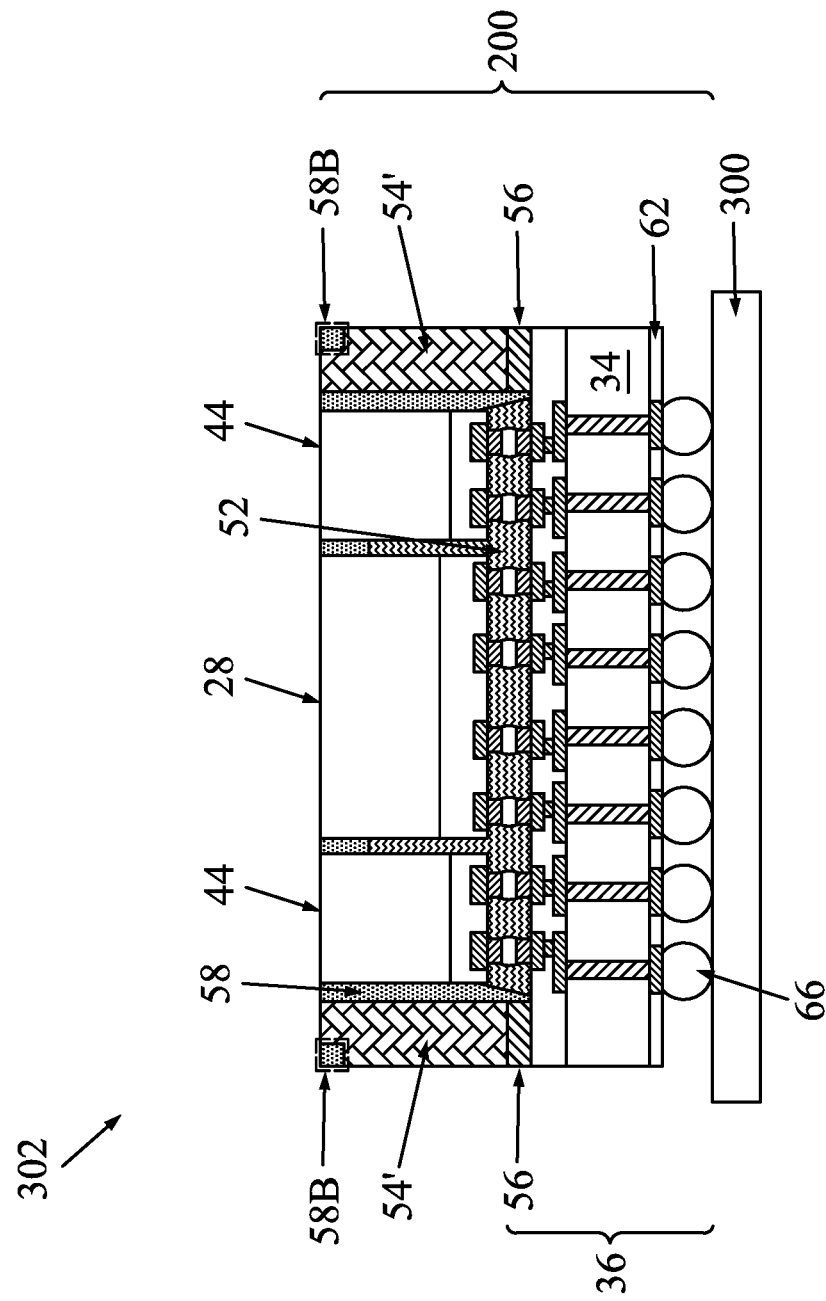
Figure 20B:
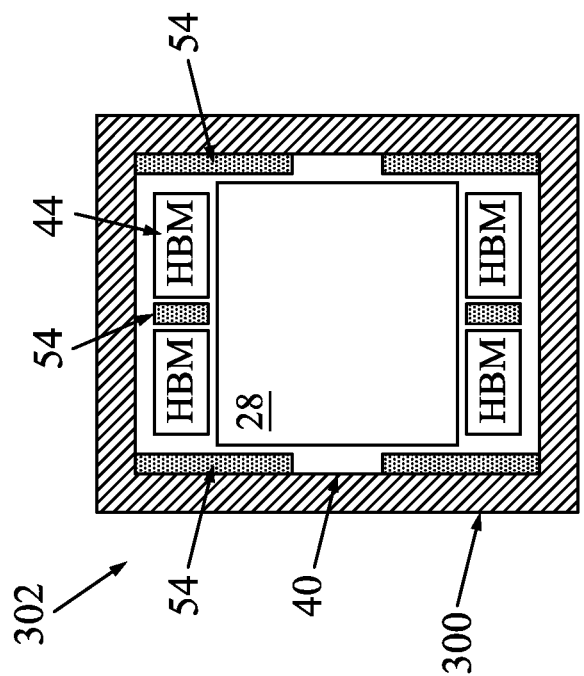
FIGS. 20A through 20F illustrate plan views of package structures in accordance with some embodiments.
Figure 20C:
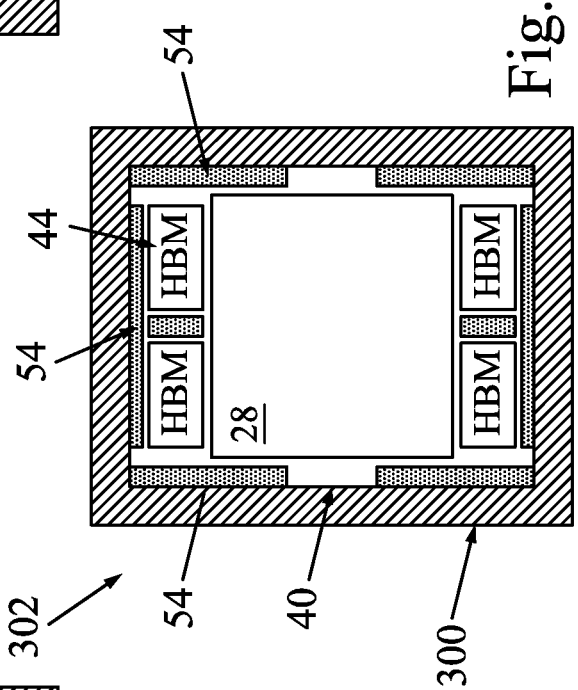
Figure 20A:
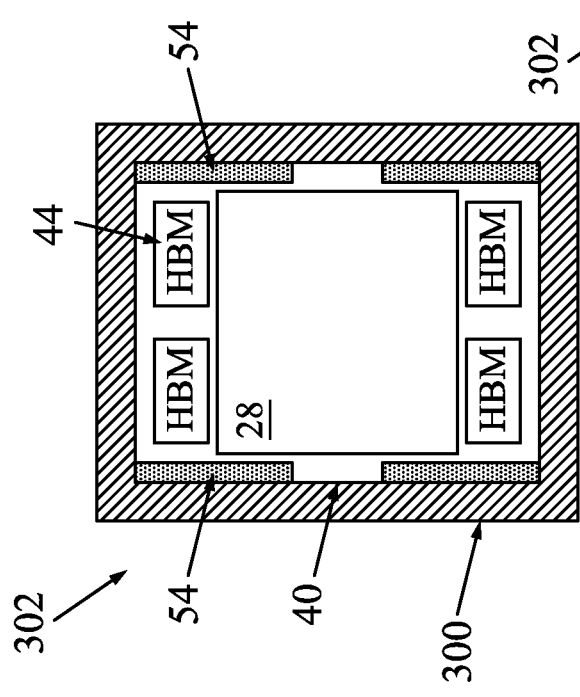
Figure 20E:
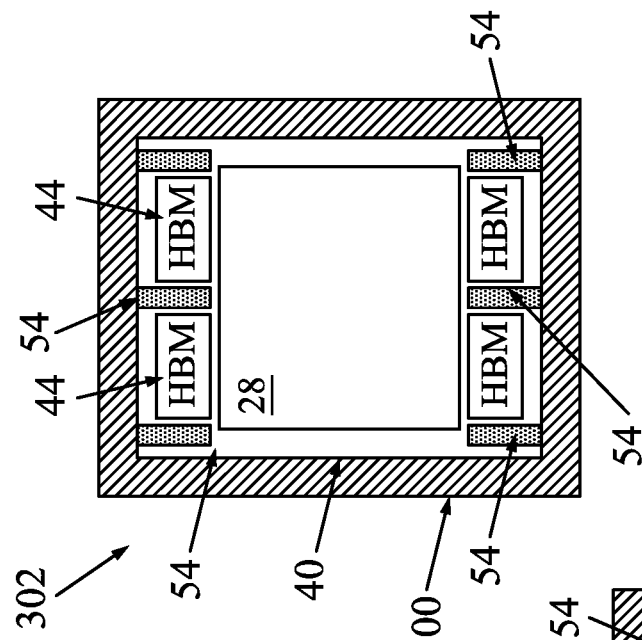
Figure 20F:
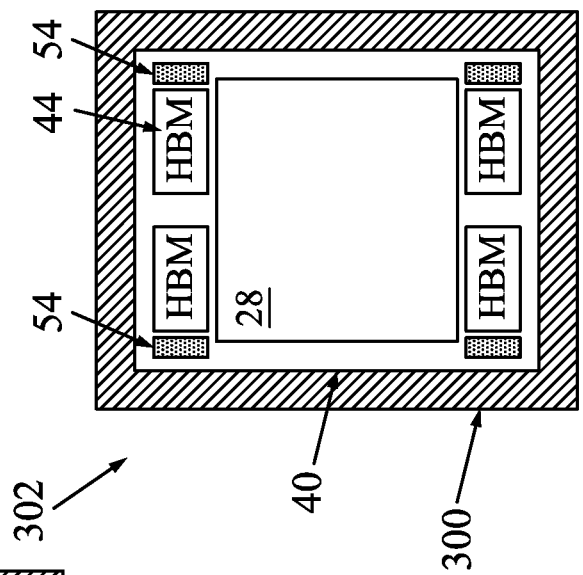
Figure 20D:
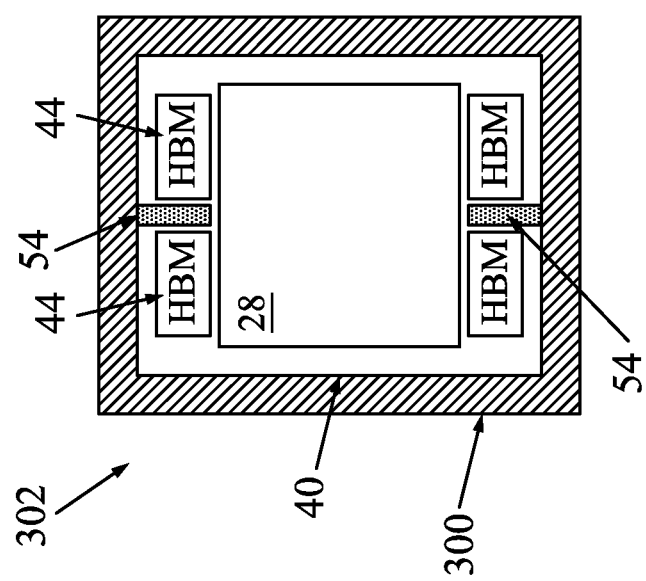
Figure 21C:
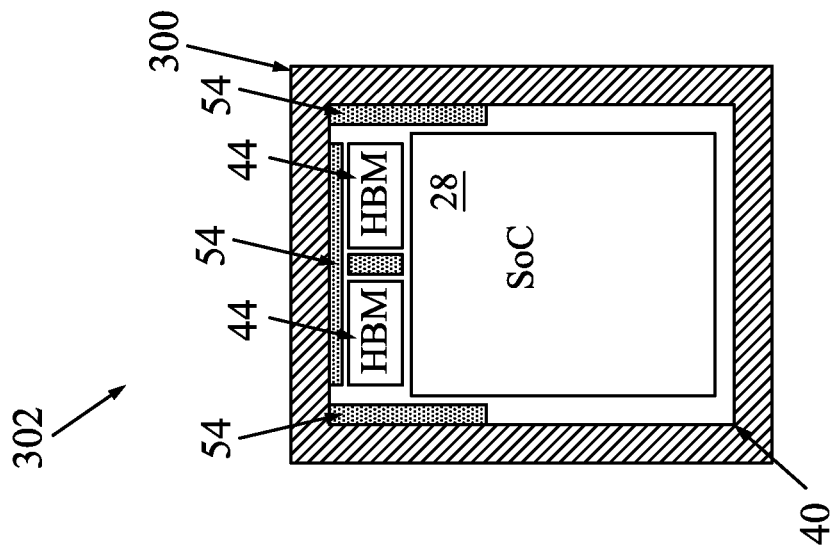
FIGS. 21A through 21F illustrate plan views of package structures in accordance with some embodiments.
Figure 21B:
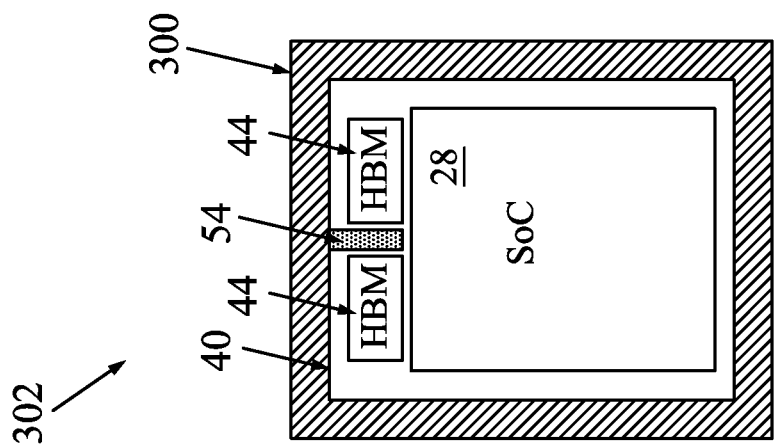
Figure 21A:
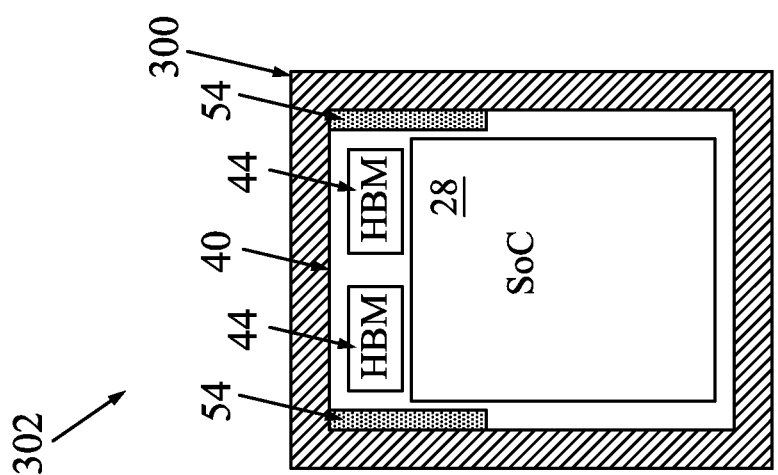
Figure 21E:
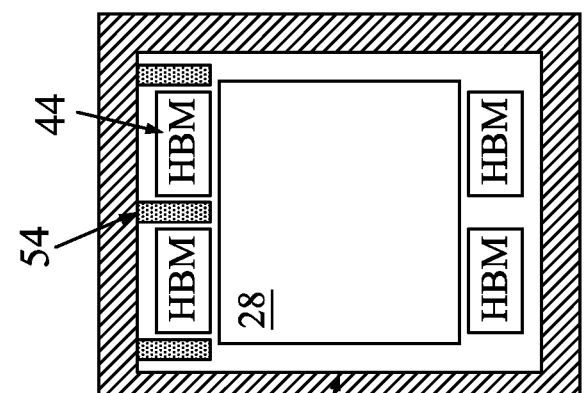
Figure 21F:
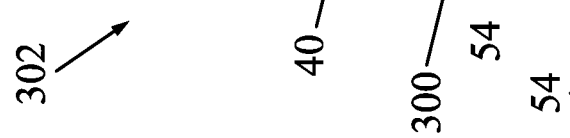
Figure 21F:
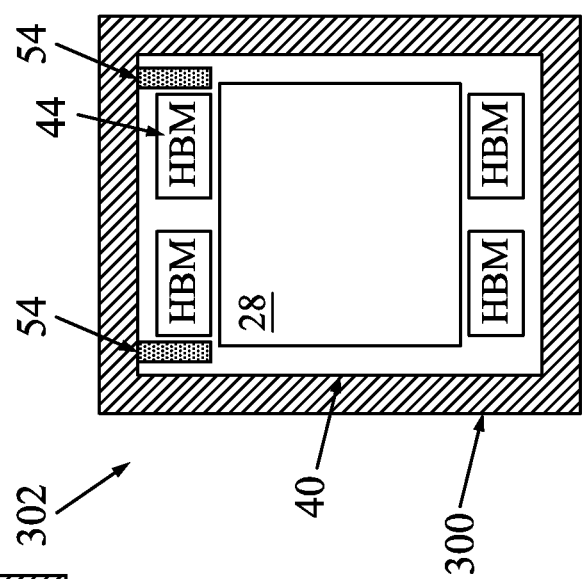
Figure 21D:
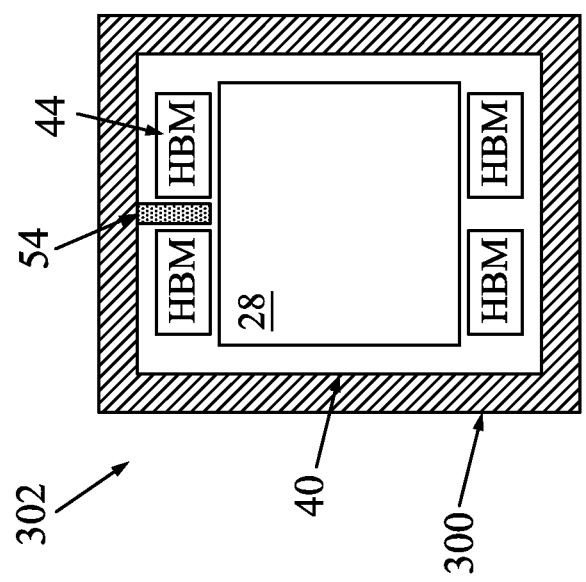

In subsequent processes, the processes shown in FIGS. 9 through 12 are performed on the structure shown in FIG. 17, the resulting structure is shown in FIG. 18. The process details are similar to what are shown in FIGS. 9 through 12, and hence are not repeated herein. In the resulting package 200, a dummy die portion 54B has a sidewall exposed. Also, encapsulant portion 58B extends from an edge of dummy die portion 54B to the edge of package 200, and encapsulant portion 58B covers (with the structure viewed upside down) dummy die portion 54B. In the singulation process to form packages 200, encapsulant portion 58B prevents the chipping of dummy die 54. The width W2 of portion 58B cannot be too small. Otherwise, encapsulant portion 58B peels from dummy die 54. In accordance with some embodiments, width W2 is greater than about 50 μm, and may be in the range between about 60 μm and about 500 μm. FIG. 19 illustrates the bonding of package 200 to package component 300 to form package 302.

FIGS. 20A, 20B, 20C, 20D, 20E, and 20F illustrate plan views of the package structures 302 corresponding to each of the dummy die 54 embodiments shown in FIGS. 6A, 6B, 6C, 6D, 6E, and 6F, respectively. These embodiments are symmetrical with package components 28 having package component 44 and dummy dies 54 on opposite sides of package components 28.

FIGS. 21A, 21B, 21C, 21D, 21E, and 21F illustrate plan views of a singulated package structure in other embodiments in each of the dummy die 54 embodiments shown in FIGS. 6A, 6B, 6C, 6D, 6E, and 6F, respectively. In these embodiments, the singulated package structures are asymmetric as the package component 44 and the dummy dies 54 are only on one side (e.g. top side of plan view in FIGS. 21A, 21B, 21C, 21D, 21E, and 21F) of the die 28. These package structures can be manufactured using similar materials, structures, and processes as those described above in FIGS. 1 through 5 and 7 through 14, and the description is not repeated herein.

Figure 22A:
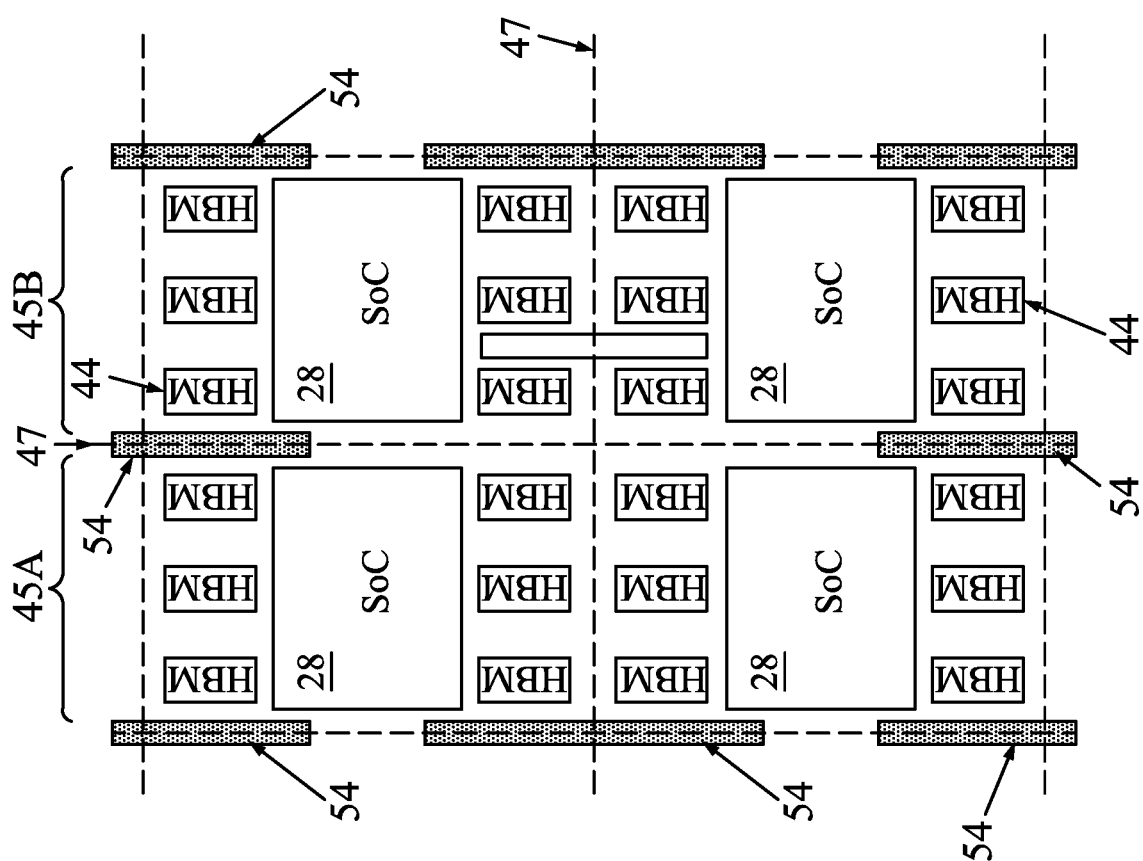
FIGS. 22A through 22D illustrate plan views of package structures in accordance with some embodiments.
Figure 22B:
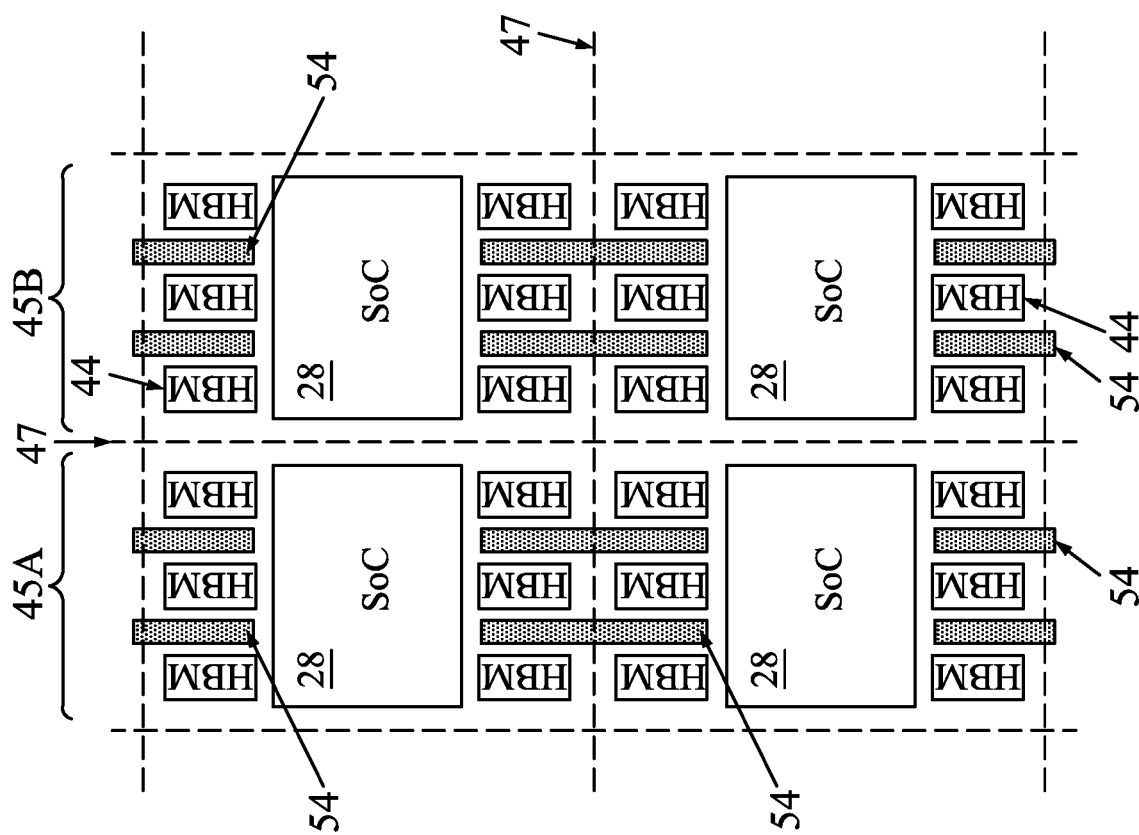
Figure 22C:
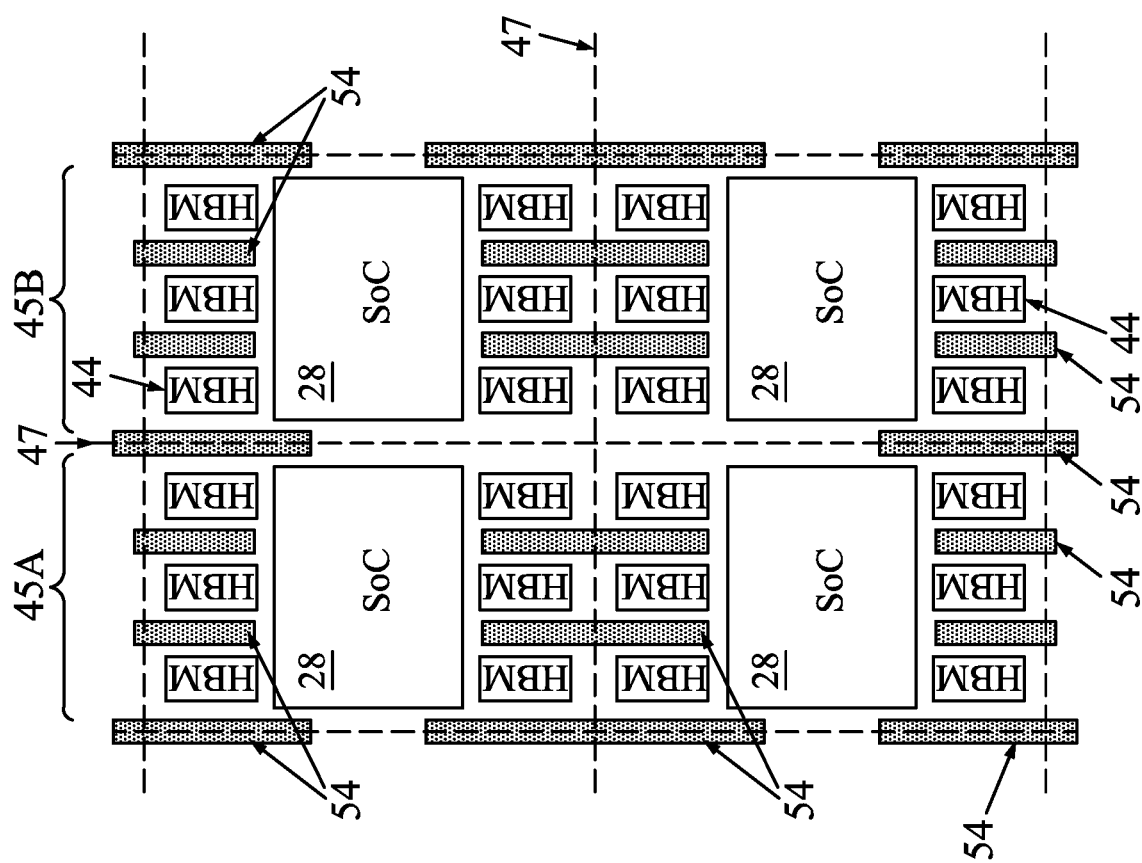

FIGS. 22A, 22B, and 22C illustrate plan views at a similar point of processing and similar in dummy die 54 configurations as FIGS. 6A, 6B, and 6C, respectively, except that in these embodiments, there are more package component 44 in each of the package structures. These package structures can be manufactured using similar materials, structures, and processes as those described above in FIGS. 1 through 5 and 7 through 14, and the description is not repeated herein.

Figure 22D:
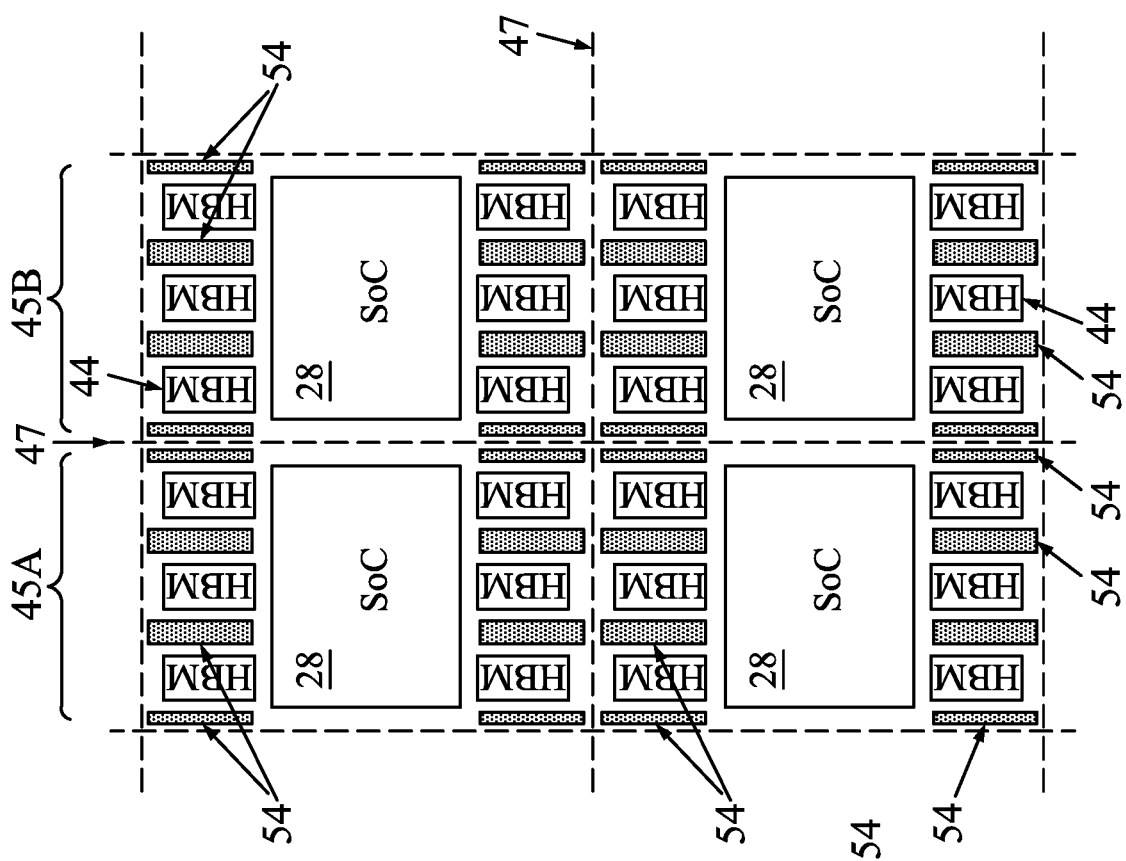

FIG. 22D illustrates a plan view of another embodiment of a dummy die 54 configuration similar to those in FIGS. 22A-22C, except that in this embodiment, the dummy dies 54 are within the regions 45A and 45B and are not in the scribe line regions 47. These package structures can be manufactured using similar materials, structures, and processes as those described above in FIGS. 1 through 5 and 7 through 14, and the description is not repeated herein. This type of configuration (e.g. no dummy dies 54 in the scribe line regions 47) can also be applied to any of the prior configurations described above.

It is appreciated that the encapsulant portions 58A (FIG. 14) or encapsulant portions 58B (FIG. 19) may exist for each of the packages formed based on FIGS. 6A, 6B, 6C, 6D, and 6D, and in each of the packages shown in FIGS. 20A, 20B, 20C, 20D, 20E, and 20F, FIGS. 21A, 21B, 21C, 21D, 21E, and 21F, and FIGS. 22A, 22B, 22C, and 22D.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. The dummy die(s) adjacent the active dies can help to reduce the warpage of the corresponding package structure. This reduction of the warpage of the package structure enables a more reliable package structure. With some portions of encapsulant left on top of the dummy dies, the undesirable chipping of the dummy dies is prevented.

In accordance with some embodiments of the present disclosure, a method comprises bonding a second package component to a first package component; bonding a third package component to the first package component; attaching a dummy die to the first package component; encapsulating the second package component, the third package component, and the dummy die in an encapsulant; performing a planarization process to level a top surface of the second package component with a top surface of the encapsulant, wherein after the planarization process, an upper portion of the encapsulant overlaps the dummy die; and sawing-through the dummy die to separate the dummy die into a first dummy die portion and a second dummy die portion, wherein the upper portion of the encapsulant is sawed through. In an embodiment, the upper portion of the encapsulant has a thickness greater than about 5 µm. In an embodiment, the second package component and the third package component are spaced apart from each other by a space, and wherein the dummy die comprises: a first portion in the space; and second portions on opposite sides of the space. In an embodiment, at a time the dummy die is sawed through, an entirety of the dummy die is covered by the encapsulant. In an embodiment, at a time the dummy die is sawed through, the dummy die comprises a first top surface that is exposed, and a second top surface covered by the upper portion of the encapsulant. In an embodiment, the dummy die comprises silicon. In an embodiment, the planarization process is performed until the third package component is further revealed.

In accordance with some embodiments of the present disclosure, a method comprises bonding a first package component to a second package component, wherein the first package component comprises a device die; attaching a dummy die to the second package component, wherein the dummy die comprises a recess; encapsulating the first package component and the dummy die in an encapsulant, wherein the encapsulant comprises a portion filling the recess; and performing a singulation process using a blade to form a package, wherein the package comprises the first package component, a portion of the second package component, and a portion of the dummy die, and wherein the blade cuts through the portion of the encapsulant in the recess. In an embodiment, the portion of the encapsulant in the recess is cut into two portions. In an embodiment, the recess is elongated with a lengthwise direction, and the blade cuts along the lengthwise direction. In an embodiment, the method further comprises, after the encapsulating and before the singulation process, performing a planarization process to expose a surface of the dummy die. In an embodiment, the portion of the encapsulant in the recess and cut through by the blade has a thickness in a range between about 5 µm and about 600 µm. In an embodiment, when the singulation process is performed, the first package component is exposed through the encapsulant.

In accordance with some embodiments of the present disclosure, a package of integrated circuits comprises a first package component; a second package component over and bonded to the first package component; a dummy die over and attached to the first package component, wherein the dummy die has a first top surface, and a second top surface lower than the first top surface; and an encapsulant encapsulating the dummy die therein, wherein the encapsulant comprises a first portion overlapping the second top surface of the dummy die, and the first top surface of the dummy die is exposed through the encapsulant. In an embodiment, the second top surface extends to an edge of the package. In an embodiment, a sidewall of the package comprises a sidewall of the dummy die. In an embodiment, the encapsulant further comprises a second portion between the dummy die and the first package component. In an embodiment, the package further comprises a third package component over and bonded to the first package component, wherein in a plane view of the package, the dummy die has a lengthwise direction, and wherein: a first straight line originating from a first end of the dummy die and perpendicular to the lengthwise direction crosses the second package component; and a second straight line originating from a second end of the dummy die and perpendicular to the lengthwise direction crosses the third package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first package component;
    a second package component over and bonding to the first package component;
    a dummy die over and attached to the first package component; and
    an encapsulant encapsulating the second package component therein, wherein the encapsulant comprises a first portion extending into the dummy die, and wherein a first top surface of the dummy die is coplanar with a second top surface of the first portion of the encapsulant.

2. The package of claim 1, wherein the encapsulant further comprises a third portion between the dummy die and the second package component, and wherein the third portion further comprises a third top surface coplanar with the first top surface of the dummy die.

3. The package of claim 2 further comprising a third package component over and bonding to the first package component, wherein the third portion of the encapsulant comprises opposing sidewalls contacting the second package component and the third package component.

4. The package of claim 1 further comprising an adhesive film adhering the dummy die to the first package component.

5. The package of claim 1, wherein the dummy die is bonded to the first package component through micro bumps.

6. The package of claim 1, wherein the first portion of the encapsulant extends to an edge of the package.

7. The package of claim 6, wherein a part of the dummy die extends to the edge of the package.

8. The package of claim 1, wherein the second package component comprises a semiconductor substrate, and wherein a third top surface of the semiconductor substrate is coplanar with the first top surface of the dummy die.

9. The package of claim 1, wherein the first portion of the encapsulant is elongated and having a lengthwise direction, and wherein the lengthwise direction is parallel to a nearest edge of the package.

10. The package of claim 1, wherein the dummy die has a top-view shape of an elongates strip.

11. A package comprising:
an interposer;
a device die over and bonding to the interposer;
a dummy die over and attached to the interposer, wherein the dummy die comprises a first edge flush with a second edge of the interposer;
an adhesive film between the dummy die and the interposer; and
a molding compound comprising a first portion between the dummy die and the device die, and a second portion extending into the dummy die, wherein the second portion of the molding compound comprises a bottom surface and a sidewall, with both of the bottom surface and the sidewall contacting the dummy die.

12. The package of claim 11, wherein an entirety of the dummy die is formed of a homogenous material, and wherein the homogenous material comprises silicon.

13. The package of claim 11 comprising a plurality of dummy dies, wherein the package comprises a plurality of edges, with each of the plurality of edges comprising an edge of one of the plurality of dummy dies.

14. The package of claim 11, wherein the dummy die comprises a first top surface and a second top surface lower than the first top surface, and wherein each of the first top surface and the second top surface is elongated and extending from a third edge to an opposing fourth edge of the dummy die.

15. The package of claim 11, wherein the second portion of the molding compound comprises a third edge flushed with the first edge of the dummy die.

16. The package of claim 11, wherein the dummy die extends to a corner of the package.

17. A package comprising:
a package component and a device die over the package component; and
a dummy die over the package component, the dummy die comprising:
a first top surface; and
a second top surface recessed lower from the first top surface, wherein each of the first top surface and the second top surface are elongated with lengthwise directions parallel to each other, and wherein each of the first top surface and the second top surface has a uniform width measured in a direction perpendicular to the lengthwise directions; and
an encapsulant comprising a first portion overlapping the second top surface of the dummy die.

18. The package of claim 17, wherein the first portion of the encapsulant contacts a first sidewall of the dummy die.

19. The package of claim 18, wherein the encapsulant further comprises a second portion contacting a second sidewall of the dummy die, wherein the first sidewall and the second sidewall are opposing sidewalls of the dummy die.

20. The package of claim 17, wherein each of the first top surface and the second top surface extends from a first edge to a second edge of the dummy die, and wherein the first edge and the second edge are opposing edges of the dummy die.

* * * * *